US012304552B2

(12) United States Patent
Staude et al.

(10) Patent No.: US 12,304,552 B2
(45) Date of Patent: May 20, 2025

(54) COMBINED CAPACITIVE SENSOR AND HEATING APPARATUS, METHOD FOR OPERATING A SENSOR AND HEATING APPARATUS, STEERING INPUT APPARATUS ASSEMBLY HAVING A SENSOR AND HEATING APPARATUS, AND VEHICLE HAVING A STEERING INPUT APPARATUS ASSEMBLY

(71) Applicant: Valeo Schalter und Sensoren GmbH, Bietigheim-Bissingen (DE)

(72) Inventors: Sascha Staude, Bietigheim-Bissingen (DE); Georg Poslowsky, Bietigheim-Bissingen (DE); Iordanis Tsinistidis, Bietigheim-Bissingen (DE); Markus Hartmueller, Bietigheim-Bissingen (DE); Raphael Mack, Bietigheim-Bissingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 384 days.

(21) Appl. No.: 17/770,792

(22) PCT Filed: Oct. 14, 2020

(86) PCT No.: PCT/EP2020/078818
§ 371 (c)(1),
(2) Date: Apr. 21, 2022

(87) PCT Pub. No.: WO2021/078592
PCT Pub. Date: Apr. 29, 2021

(65) Prior Publication Data
US 2022/0371647 A1 Nov. 24, 2022

(30) Foreign Application Priority Data

Oct. 25, 2019 (DE) ..................... 10 2019 128 887.8

(51) Int. Cl.
| | | |
|---|---|---|
| B62D 1/06 | (2006.01) | |
| B62D 1/04 | (2006.01) | |
| H03K 17/955 | (2006.01) | |
| H05B 1/02 | (2006.01) | |

(52) U.S. Cl.
CPC ............. *B62D 1/065* (2013.01); *B62D 1/046* (2013.01); *H03K 17/955* (2013.01); *H05B 1/0236* (2013.01)

(58) Field of Classification Search
CPC ...... B62D 1/046; B62D 1/065; H03K 17/955; H03K 17/962; H05B 1/0236
See application file for complete search history.

(56) References Cited

U.S. PATENT DOCUMENTS 10,252,741 B2 * 4/2019 Okazaki ............... G01D 5/2405
10,689,022 B2 * 6/2020 Okazaki ............... B62D 51/002
(Continued)

FOREIGN PATENT DOCUMENTS

| CN | 102481886 A | 5/2012 |
|---|---|---|
| DE | 102014117820 A1 | 6/2016 |

(Continued)

OTHER PUBLICATIONS

Office Action Issued in Corresponding Chinese Application No. 202080087075.1, dated Feb. 28, 2025. (13 Pages with English Translation).

*Primary Examiner* — Dana Ross
*Assistant Examiner* — Joe E Mills, Jr.

(57) ABSTRACT

The present invention relates to a combined capacitive sensor and heating apparatus (10, 60, 70) having a capacitive sensor device for detecting the presence of a capacitively effective actuation means in a detection region of the sensor device, and having a heating device, wherein the sensor and heating apparatus (10, 60, 70) has an electrical combined sensor and heating element (4), wherein a synchronization (Continued)

Figure 1:
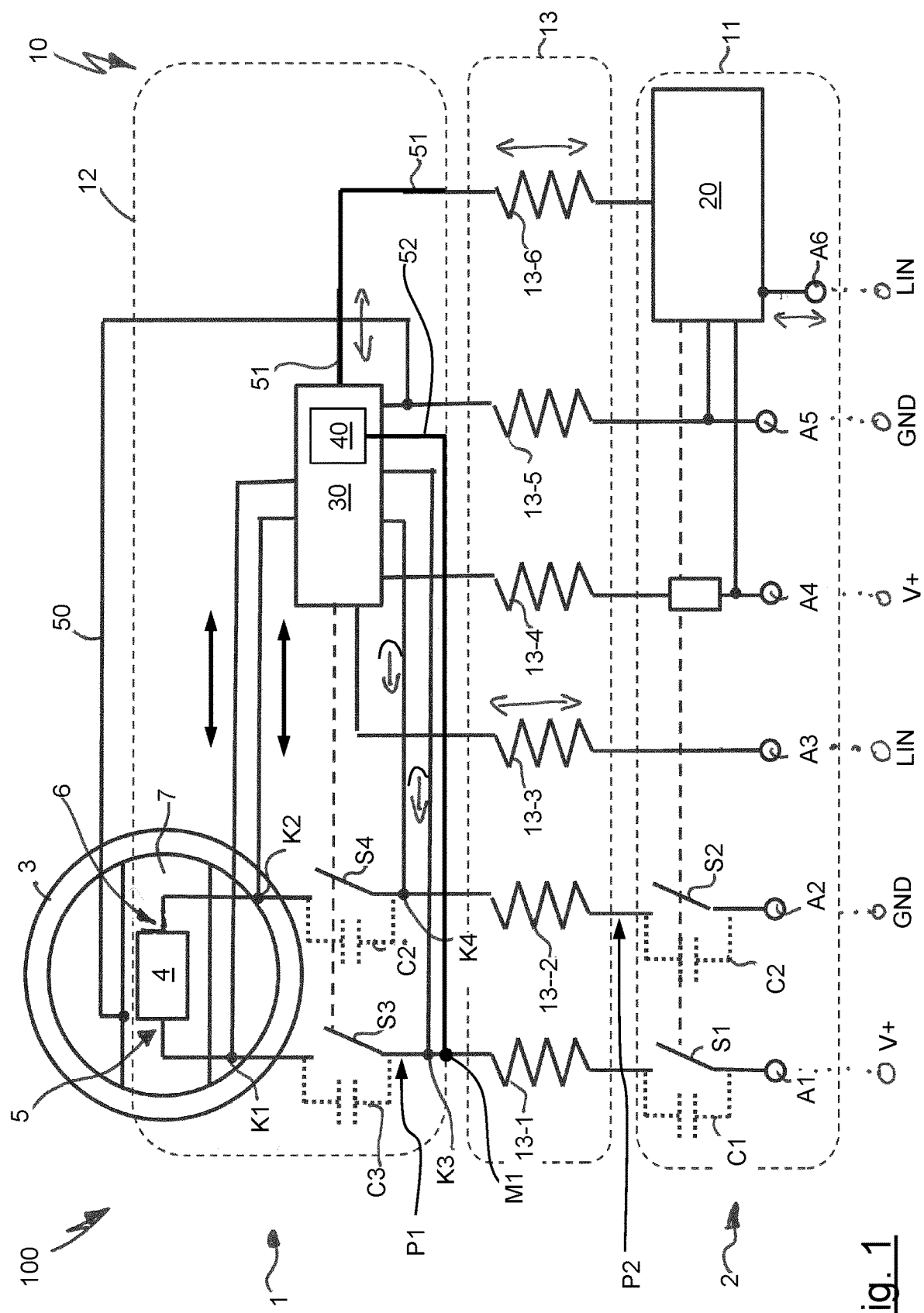

device (40) is configured to capture an actual voltage applied to the first electrical path (P1) between the first pole (V+) of a voltage source and the first connection (5) of the combined sensor and heating element (4) and/or an actual current flow and/or to capture an actual voltage applied between the second connection (6) of the combined sensor and heating element (4) and the second pole (GND) and/or an actual current flow and to detect an instantaneous actual state of the heating device on the basis thereof, and to control the sensor device and/or output at least one control signal for at least partially controlling the sensor device on the basis of the detected actual state of the heating device.

17 Claims, 3 Drawing Sheets

(56) References Cited

U.S. PATENT DOCUMENTS

| | | | |
|---|---|---|---|
| 11,565,738 B2* | 1/2023 | Zoppas | B62D 1/046 |
| 2016/0101805 A1 | 4/2016 | Nishio et al. | |
| 2019/0226879 A1* | 7/2019 | Lakatos | G01V 3/08 |

FOREIGN PATENT DOCUMENTS

| | | |
|---|---|---|
| DE | 102014117823 A1 | 6/2016 |
| DE | 112016001183 T5 | 11/2017 |
| IT | 201700048117 A1 | 11/2018 |

\* cited by examiner

COMBINED CAPACITIVE SENSOR AND HEATING APPARATUS, METHOD FOR OPERATING A SENSOR AND HEATING APPARATUS, STEERING INPUT APPARATUS ASSEMBLY HAVING A SENSOR AND HEATING APPARATUS, AND VEHICLE HAVING A STEERING INPUT APPARATUS ASSEMBLY

The invention relates to a combined capacitive sensor and heating apparatus having a capacitive sensor device for detecting the presence of a capacitively effective actuation means in a detection region of the sensor device, in particular for detecting the presence of a human hand in a gripping region of a steering input apparatus, and having a heating device, in particular having a heating device for a steering input apparatus of a vehicle, wherein the combined capacitive sensor and heating apparatus has at least one electrical combined sensor and heating element which can be used both as a capacitive sensor element by the sensor device and as an electrical heating element by the heating device. In this case, the combined sensor and heating element has a first connection and a second connection, wherein the first connection of the combined sensor and heating element can be electrically connected to and electrically disconnected from a first pole of a voltage source via a first electrical path having at least one first switching device, and wherein the second connection of the combined sensor and heating element can be electrically connected to and electrically disconnected from a second pole of the voltage source via a second electrical path having at least one second switching device. In order to operate the combined sensor and heating element as a sensor element, the first connection of the combined sensor and heating element can be electrically disconnected from the first pole of the voltage source by opening at least one switching device of the first electrical path, in particular by opening all switching devices of the first electrical path, and the second connection of the combined sensor and heating element can be disconnected from the second pole of the voltage source by opening at least one switching device of the second electrical path, in particular by opening all switching devices of the second electrical path. In order to operate the combined sensor and heating element as a heating element, the first connection of the combined sensor and heating element can be electrically connected to the first pole of the voltage source by closing all switching devices of the first electrical path. The second connection of the combined sensor and heating element can be electrically connected to the second pole of the voltage source by closing all switching devices of the second electrical path. The combined sensor and heating apparatus also has a synchronization device for at least partially synchronizing control of the sensor device and heating device.

The present invention also relates to a method for operating such a sensor and heating apparatus.

In addition, the present invention relates to a steering input apparatus assembly for a vehicle, in particular a steering wheel assembly, having a part which is on the steering wheel side and has, in particular, at least one steering wheel module, in particular a steering wheel having a steering wheel module, and a part on the vehicle body side, in particular a steering column module, wherein, in a functional installation state of the steering input apparatus assembly in a vehicle, the part on the steering wheel side can be moved relative to the part on the vehicle body side, in particular can be rotated relative to the part on the vehicle body side, in particular about an axis of rotation of a steering shaft, wherein the steering input apparatus assembly has a combined capacitive sensor and heating apparatus.

The invention also relates to a vehicle having a steering input apparatus assembly.

Combined capacitive sensor and heating apparatuses having a combined sensor and heating element are fundamentally known as such from the prior art, in which case a wide variety of configurations of sensor and heating apparatuses are known, in particular with a wide variety of connections and control operations of the combined sensor and heating element.

Against this background, an object of the invention is to provide an alternative combined capacitive sensor and heating apparatus, in particular an improved sensor and heating apparatus, and also to provide an alternative, in particular improved, method for operating such a sensor and heating apparatus, an alternative, in particular improved, steering input apparatus assembly and an alternative, in particular improved, vehicle having a steering input apparatus assembly.

This object is achieved, according to the invention, by means of a combined capacitive sensor and heating apparatus, by means of a method for operating such a sensor and heating apparatus, by means of a steering input apparatus assembly having such a sensor and heating apparatus and by means of a vehicle having a steering input apparatus assembly according to the respective independent patent claims.

Advantageous embodiments of the present invention are the subject matter of the dependent patent claims, of the description and of the figures.

A combined capacitive sensor and heating apparatus according to the invention having a capacitive sensor device for detecting the presence of a capacitively effective actuation means in a detection region of the sensor device, in particular for detecting the presence of a human hand in a gripping region of a steering input apparatus, and having a heating device, in particular having a heating device for a steering input apparatus of a vehicle, has at least one electrical combined sensor and heating element which can be used both as a capacitive sensor element by the sensor device and as an electrical heating element by the heating device, wherein the combined sensor and heating element has a first connection and a second connection, wherein the first connection of the combined sensor and heating element can be electrically connected to and electrically disconnected from a first pole of a voltage source via a first electrical path having at least one first switching device, wherein the second connection of the combined sensor and heating element can be electrically connected to and electrically disconnected from a second pole of the voltage source via a second electrical path having at least one second switching device, wherein, in order to operate the combined sensor and heating element as a sensor element, the first connection of the combined sensor and heating element can be electrically disconnected from the first pole of the voltage source by opening at least one switching device of the first electrical path, in particular by opening all switching devices of the first electrical path, and the second connection of the combined sensor and heating element can be disconnected from the second pole of the voltage source by opening at least one switching device of the second electrical path, in particular by opening all switching devices of the second electrical path, wherein, in order to operate the combined sensor and heating element as a heating element, the first connection of the combined sensor and heating element can be electrically connected to the first pole of the voltage source by closing all switching devices of the first electrical path, and the second connection of the combined sensor and heating element can be electrically connected to the second pole of the voltage source by closing all switching devices of the second electrical path, and wherein the combined sensor and heating apparatus also has a synchronization device for at least partially synchronizing control of the sensor device and heating device.

A combined capacitive sensor and heating apparatus according to the invention is characterized in that the synchronization device is or can be electrically connected to the first electrical path or to the second electrical path via at least one further electrical path and is designed and configured to capture, at least occasionally, in particular during heating operation, preferably outside a capacitive measurement, an actual voltage applied to the first electrical path between the first pole of the voltage source and the first connection of the combined sensor and heating element, in particular an actual voltage profile over time, and/or an instantaneous actual current flow, in particular an actual current flow profile over time, along the first electrical path and/or to capture an actual voltage applied to the second electrical path between the second connection of the combined sensor and heating element and the second pole, in particular an actual voltage profile over time, and/or an instantaneous actual current flow, in particular an actual current flow profile over time, along the second electrical path, wherein the synchronization device is designed and configured to detect or determine an instantaneous actual state of the heating device on the basis of the captured actual voltage, in particular on the basis of the captured actual voltage profile over time, and/or on the basis of the captured actual current flow, in particular on the basis of the captured actual current flow over time, and at least to at least partially control the sensor device and/or output at least one control signal for at least partially controlling the sensor device on the basis of the detected or determined actual state of the heating device.

Directly capturing an actual voltage and/or an actual current flow and/or associated profile, and therefore preferably a heating power output to the combined sensor and heating element, makes it possible to control the sensor device in a manner specifically adapted to the instantaneous actual state of the heating device, in particular allows sensor operation which is specifically synchronized with heating operation. In particular, this makes it possible to operate the heating device with variable clocking and, in particular, with a sensor device having a control and evaluation device that is separate from the control of the heating device, without a separate (additional) synchronization signal.

In the sense of the present invention, the term "synchronization" or "synchronizing" is merely understood in this case as meaning the suitable temporal coordination of the heating device and sensor device as such, in particular the temporal coordination of control of the components assigned thereto, that is to say the temporal coordination of the control of the components assigned to the sensor device and/or to the heating device.

Synchronization in the sense of the present invention therefore does not necessarily require an event to occur at the same time.

The variable clocking of the heating device makes it possible to control the heating device in an optimized manner with respect to the requirements and therefore allows more advantageous and therefore improved operation of the heating device.

Synchronizing the control of the sensor device on the basis of the actually captured heating power, instead of via a separate (additional) synchronization signal, for example, which is transmitted, for example and as is customary for communication between control and evaluation devices, via a data bus, for example via a LIN bus or a CAN bus, which each allow only a limited transmission rate and therefore only a limited synchronization speed, enables particularly fast synchronization, with the result that, even in the case of high clocking, that is to say a high pulse frequency of a heating power output, between the individual heating pulses, complete capacitive sensor measurements or other sensor operating cycles, for example corresponding diagnostic measurements and/or plausibility checks, can still be carried out on account of control of the sensor device which is not delayed by the transmission rate of the synchronization signal.

The above-mentioned advantages also provide advantageous prerequisites for separating or dividing the control functions for controlling the heating device and for controlling the sensor device, in particular for dividing them among different, separate control and evaluation devices which can be arranged spatially separate from one another, in particular.

This makes it possible, in particular, to divide parts of the combined capacitive sensor and heating apparatus among different assemblies or to assign them to different assemblies, as a result of which, in some cases, particularly advantageous installation space and/or package conditions and/or particularly advantageous possibilities with respect to a system architecture may arise, which is described in yet more detail below.

The use of a combined sensor and heating element both as an electrical heating element and as a capacitive sensor electrode requires an electrical connection of the sensor and heating element to a voltage source, in particular a current flow through the sensor and heating element, in particular a closed circuit, in order to operate the heating device, in particular to generate heat. In contrast, in order to operate a combined sensor and heating apparatus as a sensor device, that is to say for using the sensor and heating element as a capacitive sensor electrode, it is necessary to electrically disconnect the sensor and heating element from the voltage supply at all poles, that is to say to electrically disconnect the sensor and heating element from both poles of the associated voltage source. At least two switching devices are required for this purpose.

In a sensor and heating apparatus according to the invention, the first switching device, which is part of the first electrical path and can be used to electrically connect the combined sensor and heating element, in particular its first connection, to the first pole of a voltage source or to electrically disconnect it therefrom, and the second switching device, which is part of the second electrical path and can be used to electrically connect the combined sensor and heating element, in particular its second connection, to the second pole of the voltage source or to electrically disconnect it therefrom, are provided, in particular, for this purpose.

In the sense of the present invention, a "combined capacitive sensor and heating apparatus" is understood as meaning an apparatus which has both a capacitive sensor device and a heating device, wherein at least one component part, in particular, in this case at least the combined sensor and heating element, is jointly used both by the sensor device and by the heating device.

In the sense of the present invention, a "combined sensor and heating element" is, in particular, an electrically conductive element which can be operated both as an electrical heating element of the heating device and as a capacitive sensor electrode of the sensor device, preferably at least in succession with a time delay.

In the sense of the present invention, a "heating device" is understood as meaning an apparatus which is configured to at least occasionally output heat, wherein the heat can be particularly preferably generated by a current flow through the combined sensor and heating element and, in particular, can be output to the environment of the sensor and heating element, wherein the combined sensor and heating element is designed and configured, in particular, to be used as an electrical heating resistor.

Corresponding heating devices, including for steering wheels of a vehicle, are fundamentally known from the prior art, to which reference is made for more detailed information relating to the fundamental method of operation and general requirements imposed on the configuration of such heating devices.

In order to switch on the heating device and therefore generate heat, in particular in order to generate the current flow through the combined sensor and heating element, it is possible to close, in particular, the first switching device and the second switching device, in particular all switching devices, if present, with which the combined sensor and heating element is connected in series between the first pole of a voltage source and the second pole of the voltage source, particularly preferably in each case at the same time or in such a manner that they are at least occasionally closed at the same time, as a result of which the first connection of the combined sensor and heating element is electrically connected to the first pole of the voltage source and the second pole of the voltage source is electrically connected to the second connection of the sensor and heating element, thus enabling a current flow through the sensor and heating element, fed by the voltage source.

The voltage source is preferably a supply voltage source, in particular a DC voltage source, wherein the first pole is preferably a pole, to which a positive operating voltage is or can be applied, for example +12 V or 24 V, like in a vehicle, and the second pole is, in particular, a pole, to which a zero potential is applied, that is to say earth (0 V).

In order to switch off the heating device and therefore terminate the generation of heat, in particular in order to terminate the current flow through the sensor and heating element, at least one switching device may be opened, wherein, in order to switch off the heating device, it is particularly preferably possible to open at least the first switching device and/or the second switching device, preferably at least the first switching device and the second switching device, in particular all switching devices, with which the combined sensor and heating element is connected in series between the first pole of a voltage source and the second pole of the voltage source, in particular in each case at the same time and/or in such a manner that they are at least occasionally open at the same time, as a result of which the first connection of the combined sensor and heating element is electrically disconnected from the first pole of the voltage source and/or the second pole of the voltage source is electrically disconnected from the second connection of the sensor and heating element, as a result of which the combined sensor and heating element can be switched off at all poles.

The heating device of a sensor and heating apparatus according to the invention is particularly preferably designed and configured in this case to output a defined heating power, in particular a desired defined heating power, in particular on the basis of a requirement, for example on the basis of a captured temperature value, for example on the basis of a steering wheel temperature or the like, wherein the heating power which can be output is particularly preferably variable and can be set specifically, in particular, by means of controllable or adjustable pulse width modulation (PWM), as is fundamentally known from the prior art, to which reference is made for more detailed information and details relating to requirements and configuration possibilities in this regard.

In the sense of the present invention, a "capacitive sensor device" is a sensor device which is preferably designed and, in particular, configured to capture and preferably evaluate a capacitance, that is to say a magnitude of capacitive coupling, and/or a change in a capacitance and/or a corresponding variable which characterizes a capacitance and/or a change in a capacitance.

Capacitive sensor devices for detecting the presence of a capacitively effective actuation means in a detection region of the sensor device are fundamentally known from the prior art, including for steering wheels of vehicles, in particular for detecting a human hand in a gripping region of a steering wheel, to which reference is made for more detailed information relating to the method of operation and general requirements imposed on the configuration of such devices.

The capacitive sensor device of a sensor and heating apparatus according to the invention is designed and configured in this case, in particular, to capture and, in particular, evaluate capacitive coupling of the combined sensor and heating element to an environment of the sensor and heating element and/or to a reference electrode, in particular to a reference electrode, at which a defined potential is present, or to which a defined potential can be or is applied, a change in this capacitive coupling and/or a variable characterizing this capacitive coupling and/or the change in this capacitive coupling. The capacitive coupling or a change in the latter can be fundamentally captured in various ways in this case, in particular in the conventional ways generally known from the prior art, for example using a simple voltage measurement, a current measurement, with the aid of a resonant circuit or by means of an impedance measurement.

In one possible configuration, the capacitive coupling or the change in the latter can be captured by means of the so-called CVD method (Capacitive Voltage Divider method). It can be inferred from the captured capacitive coupling or the change in the latter whether or not there is a capacitive actuation means in the detection region of the sensor device. Alternatively, in another possible configuration of a combined sensor and heating apparatus, the capacitive coupling or the change in the latter may also be captured, for example, by applying a defined voltage signal to the combined sensor and heating element, simultaneously measuring the current flow arising in the process and determining a phase shift between the voltage signal and the current flow and determining the magnitude of the capacitive coupling or a change in the latter from the phase shift, which is established on the basis of the capacitive coupling of the heating and sensor element to the environment and/or to a reference electrode, for example by means of one or more ASICs (ASIC=application-specific IC) which are specifically configured for this purpose.

The sensor device of a sensor and heating apparatus according to the invention is particularly preferably designed to detect the presence of a human hand in a gripping region of a steering wheel, in particular to detect when a human hand approaches and/or moves away from the steering wheel, and/or to detect when the steering wheel is touched by a human hand, in particular to detect a change in the touching of the steering wheel by a human hand, for example a position change of a hand on the steering wheel.

The combined sensor and heating element of a combined sensor and heating apparatus according to the invention is designed in this case, in particular, to form, with an environment and/or a reference electrode, a defined capacitance which changes with respect to a reference state when a capacitively effective actuation means is present in the detection region of the sensor and heating element, wherein the change in the capacitance, and therefore the change in the capacitive coupling between the sensor and heating element and the environment and/or the reference element, is proportional, in particular, to a distance between the actuation means and the sensor element.

A sensor and heating apparatus according to the invention may have in this case one combined sensor and heating element or a plurality of combined sensor and heating elements which are preferably each connected to an associated voltage source according to the same principle. This enables spatially resolved detection and therefore, for example, a distinction as to whether one or two hands of a driver of a vehicle are on a steering wheel and/or where a driver grips a steering wheel in a gripping region of the steering wheel.

The combined sensor and heating element is particularly preferably an electrically conductive structure having one or more electrical conductors, wherein, in the case of a plurality of electrical conductors, the latter are, in particular, electrically coupled to one another in a suitable manner, in particular contact-connected and/or connected to one another in a suitable manner.

A combined sensor and heating element may be, for example, an elongated wire-like or thread-like conductor which can be arranged, in particular, around a core of a steering wheel rim, for example in a meandering manner. In this case, the sensor and heating element may be arranged on and/or applied to, for example stitched to and/or adhesively bonded to, a carrier body, or may be incorporated in a carrier body and woven or embedded in the latter or the like, for example, preferably in each case in such a manner that the sensor and heating element extends over an area which is as large as possible.

At least one sensor and heating element may also be a heating mat, in particular a fabric composed of electrical conductors or the like or a mesh composed of a plurality of individual conductors which are or can be arranged in the form of a grid or are arranged on a carrier in the form of a grid or are incorporated in a carrier.

In this case, the first connection of the combined sensor and heating element is preferably an input connection and the second connection of the sensor and heating element is an output connection, in particular.

In order to operate the combined sensor and heating apparatus as a sensor device and therefore to operate the combined sensor and heating element as a capacitive sensor electrode, the sensor and heating element may be preferably electrically disconnected both from the first pole of a voltage source and from the second pole of the voltage source, in particular by opening at least the first switching device and the second switching device, preferably in each case at the same time and/or in such a manner that they are at least occasionally open at the same time. In addition, switching devices present along the first electrical path and/or the second electrical path may preferably additionally also each be opened.

In the sense of the present invention, a "switching device" is a device which is designed to establish or electrically disconnect an electrical connection between two components of an electrical circuit arrangement, wherein the electrical connection is disconnected in an open state of the switching device and the electrical connection is established in a closed state of the switching device. In this case, a switching device may be an assembly having a plurality of electronic component parts, in particular a plurality of switching elements, or only one individual switching element, that is to say an individual switch, wherein a switching element may be a field effect transistor, for example.

At least one switching device of a sensor and heating apparatus according to the invention is an electronic switching device, that is to say not a mechanical switching device, and has, in particular, at least one semiconductor component, wherein at least one switching device can be controlled, in particular, by a control device, preferably by means of at least one control signal, wherein, in particular, at least the first switching device and/or the second switching device, in particular all switching devices of a sensor and heating apparatus according to the invention, is/are electronic switching devices.

In one possible, in particular advantageous, configuration of a combined capacitive sensor and heating apparatus according to the present invention, the combined capacitive sensor and heating apparatus, in particular the heating device, is preferably designed and configured to output a heating power, in particular a desired heating power, in a pulsed manner, preferably on the basis of a requirement, wherein a pulsed current flow, in particular with a defined, preferably constant, voltage, can preferably be guided through the at least one combined sensor and heating element for this purpose, wherein the pulsed current flow can be modulated, in particular, by means of pulse width modulation in such a manner that the desired heating power is output, wherein an average output heating power can particularly preferably be changed by changing the period duration, a pulse width and/or a spacing between the pulses. This makes it possible to easily adapt the output heating power, for example on the basis of a heating power requirement or in response to a heating power requirement.

In this case, a voltage can particularly preferably be kept constant, but this is not necessary, and a change in the voltage in order to change the output heating power is likewise conceivable. However, a constant voltage enables a particularly simple configuration of a heating device, in particular if the level of the voltage at the first pole of the associated voltage source does not have to be modulated.

In a further possible, in particular advantageous, configuration of a combined capacitive sensor and heating apparatus according to the present invention, the combined capacitive sensor and heating apparatus, in particular the sensor device, is designed and configured, in particular, to carry out sensor operation, in particular one or more capacitive measurements for detecting the presence of a capacitively effective actuation means in a detection region of the sensor device and/or a diagnosis of the sensor device, at least partially, in particular completely, between two heating power pulses. This enables, in a simple manner, selective, time-delayed but ultimately joint use of the combined sensor and heating element.

In a further possible, in particular advantageous, configuration of a combined capacitive sensor and heating apparatus according to the present invention, the at least one further electrical path, via which the synchronization device can capture an actual voltage and/or an actual current flow in the first electrical path or in the second electrical path, is or can be electrically connected to the first electrical path via a synchronization connection node situated along the first electrical path between the first switching device and the first connection of the combined sensor and heating element and/or to the second electrical path via a synchronization connection node situated along the second electrical path between the second connection of the combined sensor and heating element and the second switching device.

In the sense of the present invention, a "connection node" is, in particular, a line branch or a line branching of an electrical line.

This structure, that is to say a tap downstream of at least the first or second switching device in the first or second electrical path or between the switching device and connection of the sensor and heating element, that is to say not directly downstream of the respective pole of the voltage source, makes it possible to capture an actual state of the heating device in a particularly advantageous and simple manner. In particular, in addition to capturing a current flow which allows a conclusion to be drawn on an output heating power (no current flow, no heating power, capture of current and voltage over time=heating power), this structure makes it possible, in particular, to capture when all poles are switched off and/or all poles are switched on, in addition to capturing when a heating power is applied (heating operation) and/or when no heating power is applied (zero power, but without all poles being switched off) and capturing constant heating operation.

In one further possible, in particular advantageous, configuration of a combined capacitive sensor and heating apparatus according to the present invention, the combined sensor and heating apparatus also particularly preferably has at least one control and evaluation device, in particular a first control and evaluation device, which is configured to at least partially control the sensor device of the combined capacitive sensor and heating apparatus, in particular to control operation of the combined sensor and heating element as a sensor element, and a control and evaluation device which is configured to at least partially control the heating device of the combined capacitive sensor and heating apparatus, in particular a second control and evaluation device, in particular for controlling operation of the sensor and heating element as a heating element, wherein the second control and evaluation device is, in particular, separate from the first control and evaluation device.

The separate configuration of the heating and sensor function, in particular the assignment to separate control devices, enables a particularly flexible system architecture and division of the components of a sensor and heating apparatus according to the invention among at least two separate assemblies, in particular a particularly advantageous division for a steering input apparatus assembly of a vehicle having a part on the steering wheel side and a part on the vehicle body side. The synchronization device enables, in a simple and particularly advantageous manner, synchronized operation of the separate control and evaluation devices and consequently a particularly efficient configuration of a combined sensor and heating apparatus according to the invention.

In a further possible, in particular advantageous, configuration of a combined capacitive sensor and heating apparatus according to the present invention, the combined sensor and heating apparatus is designed and configured, in particular, for integration in a steering input apparatus assembly of a motor vehicle having a part on the steering wheel side and a part on the vehicle body side, wherein the combined sensor and heating apparatus preferably has a first assembly which is designed and configured for integration in that part of a steering input apparatus assembly which is on the vehicle body side, and, in particular, a second assembly which is designed and configured for integration in that part of a steering input apparatus assembly which is on the steering wheel side, and wherein some parts of the combined sensor and heating apparatus are preferably assigned to the first assembly and other parts are assigned to the second assembly.

In the sense of the present invention, an "assembly" is a group of at least two component parts, in particular an assembly of at least two component parts.

In the sense of the present invention, a "steering input apparatus assembly" is an assembly which has at least one part which is on the steering wheel side and has at least one component part designed for arrangement on the steering wheel side, and a part which is on the vehicle body side and has at least one component part designed for arrangement on the vehicle body side, in particular on the steering column side, wherein, in a functional installation state of the steering input apparatus assembly in a vehicle, that part of the steering input apparatus assembly which is on the steering wheel side can be moved, in particular, relative to the part on the vehicle body side, in particular can be rotated with respect to the part on the vehicle body side, in particular about an axis of rotation of a steering shaft. In this case, the part on the steering wheel side may also have one or more assemblies designed for arrangement on the steering wheel side. The part on the vehicle body side may accordingly also have one or more assemblies designed for arrangement on the vehicle body side. A steering input apparatus may be, in particular, a steering wheel or a small steering horn or a joystick or the like.

This makes it possible to provide a steering input apparatus assembly which requires only a few components on the steering wheel side. The division into at least two assemblies makes it possible to provide a sensor and heating apparatus having a second assembly designed for integration in a part on the steering wheel side, which, in comparison with a configuration having only one assembly to be completely integrated in the part on the steering wheel side, has a lower installation space requirement on the steering wheel side on account of a smaller number of components assigned to the second assembly, but nevertheless enables high capture accuracy. The division of the individual components into at least two assemblies makes it possible to integrate a sensor and heating apparatus according to the invention in a steering input apparatus assembly in a particularly advantageous manner.

Such a configuration makes it possible, in particular, to transfer a multiplicity of components to a part on the vehicle body side. This makes it possible to achieve a lower installation space requirement of the part on the steering wheel side.

In a further possible, in particular advantageous, configuration of a combined capacitive sensor and heating apparatus according to the present invention, the first assembly and the second assembly are electrically connected to one another, in particular via an electrical connecting device, in particular for the purpose of transmitting signals and/or energy, wherein the electrical connecting device has a coil spring, in particular, or is a coil spring.

The electrical connection of at least two switching devices of different assemblies via the electrical connecting device makes it possible to jointly use the switching devices both for the heating device and for the sensor device across the assemblies.

In the sense of the present invention, a "coil spring" is, in particular, an electrical connecting device which is designed to electrically connect a component part designed to be fastened on the vehicle body side and/or an assembly designed to be fastened on the vehicle body side, for example a stator which can be connected to a steering shaft in a rotationally fixed manner and/or a steering column module, to a component part designed to be fastened on the steering wheel side and/or an assembly designed to be fastened on the steering wheel side, for example to a rotor which can be connected to the steering wheel in a rotationally fixed manner and/or to a steering wheel module which can be integrated in a steering wheel, in particular for the purpose of transmitting signals and/or energy, wherein, in a functional installation state in a vehicle, the component part designed to be fastened on the steering wheel side or the assembly designed to be fastened on the steering wheel side is movable relative to the component part designed to be fastened on the vehicle body side or the assembly designed to be fastened on the vehicle body side, in particular rotatable, preferably about an axis of rotation of a steering shaft.

A coil spring, and therefore an electrical connecting device, preferably has one or more electrically conductive conductor tracks which are insulated from one another and may be arranged in one or more planes, wherein a coil spring may particularly preferably be a flat conductor having one or more conductor track planes, wherein the coil spring is particularly preferably designed to be at least partially accommodated by a so-called coil spring cassette, in particular to be at least partially rolled up in a coil spring cassette. Coil springs and coil spring cassettes are fundamentally known from the prior art, to which reference is made for more detailed statements relating to the general method of operation and configuration of coil springs.

Any desired configuration of the electrical connecting device is possible in principle, but the electrical connecting device is particularly preferably designed in such a manner that the first assembly of a sensor and heating apparatus according to the invention can be connected to the second assembly of the sensor and heating apparatus in such a manner that the sensor and heating apparatus according to the invention can be integrated in a steering input apparatus assembly having a part on the steering wheel side and a part on the vehicle body side, wherein the first assembly can be integrated, in particular, in the part on the vehicle body side and the second assembly can be integrated in the part on the steering wheel side.

In this case, the first assembly of a sensor and heating apparatus according to the invention is preferably designed and configured to be integrated in a steering column module, in particular a steering column module which can be fastened to a vehicle body, in particular in a so-called "top column module (TCM)", that is to say is designed and configured to be at least partially arranged in said module and/or accommodated by said module.

The second assembly of a sensor and heating apparatus according to the invention is preferably designed and configured to be integrated in a steering wheel of a vehicle, wherein the combined heating and sensor element is particularly preferably designed to be integrated and/or introduced into a steering wheel rim of a steering wheel, and at least the respective switching devices of the second assembly are designed and configured, in particular, for integration in a steering wheel module, wherein the steering wheel module is particularly preferably designed for arrangement and/or integration in a steering wheel.

In this case, the combined sensor and heating element is preferably assigned to the second assembly. The control and evaluation device which is designed and configured to at least partially control the sensor device, in particular the first control and evaluation device, is preferably assigned to the second assembly. The control and evaluation device which is designed and configured to at least partially control the heating device, in particular the second control and evaluation device, is preferably assigned to the first assembly.

Further components of the heating device, for example power-relevant components of the heating device and/or corresponding safety devices, for example one or more overvoltage protection devices and/or polarity reversal protection devices, are preferably likewise assigned to the first assembly, in particular including the first switching device and/or the second switching device.

In principle, however, an assignment to the respective other assembly or no division into assemblies is also conceivable in each case.

In a further possible, in particular advantageous, configuration of a combined capacitive sensor and heating apparatus according to the present invention, the synchronization device is particularly preferably part of the second assembly, in particular if the control and evaluation device for controlling the sensor device (sensor control device) is part of the second assembly. This makes it possible to control the sensor device in a particularly efficient manner since no or scarcely any time losses arise during communication between the synchronization device and the sensor control device since no communication across the assemblies is required, in particular. The synchronization device may also be integrated in the control and evaluation device for controlling the sensor device. In this case, a sensor and heating device according to the invention is particularly preferably designed to capture the actual voltage and/or an actual current flow and/or a corresponding profile immediately after receipt into the second assembly and, within the second assembly, on the respective associated electrical path, in particular immediately downstream of the electrical connecting device.

In a further possible, in particular advantageous, configuration of a combined capacitive sensor and heating apparatus according to the present invention, the control and evaluation device which is designed to at least partially control the heating device (heating control device) is preferably designed to control the first switching device and/or the second switching device, wherein the first switching device and/or the second switching device is/are particularly preferably likewise parts of the first assembly.

The control devices, in particular the first control device and the second control device, are particularly preferably likewise electrically connected to one another in this case via the electrical connecting device, in particular for the purpose of transmitting signals and/or energy, wherein at least one signal transmission line which is separate from an energy transmission line is particularly preferably provided for the purpose of transmitting signals, wherein separate signal transmission and/or energy transmission lines may be respectively provided, in particular.

This makes it possible to achieve an advantageous architecture of a sensor and heating apparatus according to the invention, in particular a simple and cost-effective structure.

This makes it possible, in particular, for the load paths for transmitting energy to the combined heating and sensor element, which must be designed to transmit high currents, to be able to be disconnected from the paths for transmitting signals and the paths for supplying energy, for example a control device which is assigned to the second assembly and must be used to transmit only low currents in comparison. This enables simple protection, for example against overloading, in particular of the assembly which has a lower load and component parts of smaller dimensions, thus making it possible to achieve a cost advantage.

For communication of the control devices, the control devices may be coupled, in particular additionally, via a bus, in particular via a LIN bus, a CAN bus or a FlexRay bus. The second assembly, in particular the second control device, particularly preferably may be communicatively connected to one or more further components, for example to a control unit fastened to the vehicle body, only via the electrical connecting device and the first assembly. In principle, however, it is also possible to directly connect the second assembly, that is to say without looping the signal and/or energy transmission paths through the first assembly.

In a further possible, in particular advantageous, configuration of a combined capacitive sensor and heating apparatus according to the present invention, more than one switching device may be respectively connected in series in the first electrical path and/or in the second electrical path. This makes it possible to considerably improve the measurement accuracy of the sensor device. In particular, interference effects on account of parasitic capacitances which arise can be reduced by means of additional switching devices which are respectively connected in series with the first and second switching devices, which is explained in yet more detail below.

At least one third switching device is preferably connected in series with the first switching device in the first electrical path and/or a fourth switching device is connected in series with the second switching device, wherein, if present, the third switching device is arranged, in particular, between the first switching device and the first connection of the combined sensor and heating element and the fourth switching device, if present, is arranged, in particular, between the second connection of the combined sensor and heating element and the second switching device, wherein, if the first switching device and the third switching device are each parts of the first assembly and the third switching device and the fourth switching device are each parts of the second assembly, the first and second assemblies of the combined sensor and heating apparatus are preferably electrically connected to one another via the electrical connecting device in such a manner that the first switching device and the third switching device connected in series with the latter are electrically connected to one another for the purpose of transmitting signals and/or energy, and the second switching device and the fourth switching device connected in series with the latter are electrically connected to one another for the purpose of transmitting signals and/or energy.

In a further advantageous configuration of a sensor and heating apparatus according to the present invention, the combined capacitive sensor and heating apparatus may have, in particular, a first sensor connection node, in particular a first sensor connection node which is arranged between the third switching device and the first connection of the combined heating and sensor element and is electrically connected to the first connection of the combined heating and sensor element.

Furthermore, at least one control device, preferably the control device configured to at least partially control a sensor function, may be designed and configured to feed in a defined input measurement signal at the first sensor connection node and/or to tap off and, in particular, evaluate an output measurement signal for the purpose of detecting the presence of a capacitively effective actuation means in a detection region of the sensor device, wherein the control device preferably has, for this purpose, at least one output and/or input which is or can be electrically connected to the first connection of the combined heating and sensor element via the first sensor connection node. This makes it possible to capture capacitive coupling of the heating and sensor element to the environment and/or to a reference electrode or a change in said capacitive coupling in a particularly simple and advantageous manner for the purpose of detecting the presence of a capacitively effective actuation means in the region of the steering wheel.

In a further advantageous configuration of a sensor and heating apparatus according to the present invention, the combined capacitive sensor and heating apparatus may also have, in particular, a second sensor connection node, in particular a second sensor connection node which is arranged between the second connection of the combined heating and sensor element and the fourth switching device and is electrically connected to the second connection of the combined heating and sensor element, wherein at least one control device, preferably the control device configured to at least partially control a sensor function, is designed and configured, in particular, to feed in a defined input measurement signal at the second sensor connection node and/or to tap off and, in particular, evaluate an output measurement signal for the purpose of detecting the presence of a capacitively effective actuation means in the region of the steering wheel, wherein the control device preferably has, for this purpose, at least one input and/or output which is or can be electrically connected to the second connection of the combined heating and sensor element via the second sensor connection node.

As a result, a defined voltage signal can be applied to the combined heating and sensor element, for example via the first sensor connection node, the resulting current flow can be measured at the same time and a phase shift between the voltage signal and the current flow can be determined and the magnitude of the capacitive coupling or a change in the latter can be determined from the phase shift, which is established on the basis of the capacitive coupling of the heating and sensor element to the environment and/or to a reference electrode, for example by means of one or more ASICs (ASIC=application-specific IC) which are specifically configured for this purpose.

The plausibility of the capacitive coupling of the heating and sensor element to the environment and/or to a reference electrode or a change in said capacitive coupling can be checked by comparing the results determined at the first sensor connection node and the results determined at the second sensor connection node, in particular in a conventional manner which is fundamentally known from the prior art.

The switching devices each generate parasitic capacitances (or rather these are always present due to technical reasons), via which, during operation of the combined sensor and heating apparatus as a sensor device, a portion of an input measurement signal, which is applied while capturing capacitive coupling of the heating and sensor element to the environment and/or to a reference electrode and is applied, in particular, between the first switching device and the first connection of the heating and sensor element and/or between the second connection of the heating and sensor element and the second switching device, can flow away in each case, as a result of which the captured output measurement signal and therefore captured capacitive coupling of the heating and sensor element to the environment and/or to a reference electrode can be distorted in an undesirable manner.

The flowing away of a portion of an input measurement signal applied between the first switching device and the first connection of the heating and sensor element can be counteracted, in particular, by the additional, third switching device which may be connected in series with the first switching device between the first connection of the heating and sensor element and the first switching device, preferably by opening both (the first and the third switching device) during sensor operation, in particular during a capacitive measurement, and applying and/or feeding in a compensation signal between the first switching device and the third switching device, in particular to/at a third sensor connection node, wherein the compensation signal corresponds, in particular, to the input measurement signal and is preferably identical to the latter and/or additionally has a corresponding compensation portion. This makes it possible to considerably reduce the flowing away of a portion of an applied input measurement signal and/or of a compensation signal in the direction of the first pole, thus making it possible to reduce, although not entirely compensate for, the influence of the parasitic capacitance caused by the switching device. However, a higher capture accuracy of the sensor device can be achieved.

The flowing away of a portion of an input measurement signal applied between the second connection of the heating and sensor element and the second switching device can be counteracted, in particular, by the additional, fourth switching device which may be connected in series with the second switching device between the second connection of the heating and sensor element and the second switching device, by opening them (the second and the fourth switching device), preferably during sensor operation, in particular during a capacitive measurement, and applying and/or feeding in a compensation signal between the fourth switching device and the second switching device, in particular to/at a fourth sensor connection node, wherein the compensation signal corresponds, in particular, to the input measurement signal and is preferably identical to the latter and/or additionally has a corresponding compensation portion. This makes it possible to considerably reduce the flowing away of a portion of an input measurement signal and/or of a compensation signal in the direction of the second pole, thus making it possible to reduce, although not entirely compensate for, the influence of the parasitic capacitance caused by the switching devices. However, a higher capture accuracy of the sensor device can be achieved.

The third switching device and fourth switching device respectively additionally present in series with the first switching device and the second switching device make it possible to apply a compensation signal to the circuit, in particular to apply and/or feed in a compensation signal between two switching devices, in particular between the first and third switching devices and between the fourth and second switching devices, without the compensation signal being immediately compensated for via the respective associated pole if the additional switching device is opened during operation of the sensor device, with the result that a potential imbalance which is otherwise present at the third and/or fourth switching device can be compensated for by means of the compensation signal. The lower the potential imbalance at a switching device, the lower the influence of the parasitic capacitance caused by the latter.

In order to enable the above-described at least partial compensation for parasitic capacitances, in a further advantageous configuration of a sensor and heating apparatus according to the present invention, the sensor and heating apparatus therefore also preferably has, in particular in addition to the third switching device, a further sensor connection node arranged between the first switching device and the third switching device, in particular a third sensor connection node which can be electrically connected to the first connection of the combined heating and sensor element via the third switching device, and/or a further sensor connection node arranged between the fourth switching device and the second switching device, in particular a fourth sensor connection node which can be electrically connected to the second connection of the combined heating and sensor element via the fourth switching device, wherein at least one control device, preferably the control device configured to at least partially control a sensor function, is designed and configured to apply a compensation signal to this sensor connection node, preferably a compensation signal which corresponds to the input measurement signal, wherein the control device preferably has for this purpose at least one output which is or can be electrically connected to the further sensor connection node. In this case, the third sensor connection node and the fourth sensor connection node may be electrically connected or connectable to the same output of an associated control device or to different outputs.

The further sensor connection node, in particular the third sensor connection node and/or the fourth sensor connection node, is preferably respectively assigned to the second assembly in this case and is arranged, in particular, between the electrical connecting device, which is used to electrically connect the first switching device and the third switching device to one another, and the third or fourth switching device. Such a configuration of a sensor and heating apparatus according to the invention makes it possible to at least partially compensate for parasitic capacitances in a particularly simple manner.

In one advantageous configuration of a combined capacitive sensor and heating apparatus according to the invention, the first switching device is preferably a so-called high-side switching device (HSS), in particular the only high-side switching device for connecting the combined heating and sensor element to the first pole of a voltage source, wherein at least the first switching device and/or the third switching device is/are particularly preferably in the form of a so-called PMOS switching device. Alternatively, however, the first switching device and/or the third switching device may fundamentally also be in the form of a so-called NMOS switching device, assuming suitable contact-connection.

In a further advantageous configuration of a combined capacitive sensor and heating apparatus according to the invention, the second switching device is preferably a so-called low-side switching device (LSS), in particular the only low-side switching device for connecting the combined heating and sensor element to the second pole of the voltage source, wherein the second switching device and/or the fourth switching device is/are particularly preferably in the form of a so-called NMOS switching device. Alternatively, however, the second switching device and/or the fourth switching device may fundamentally also be in the form of a so-called PMOS switching device, assuming suitable contact-connection.

High-side switching devices (HS switching devices), low-side switching devices (LS switching devices), PMOS and NMOS switching devices are fundamentally known from the prior art, wherein, in a circuit assembly having a DC voltage source, that switching device which is closest to the pole of a voltage source at which the higher potential is present is referred to as the high-side switching device, in particular, whereas, in a circuit assembly having a DC voltage source, that switching device which is closest to the pole with the lower potential is a low-side switching device, in particular.

NMOS and PMOS switching devices are each special switching devices which are fundamentally known from the prior art and have at least one semiconductor component, in particular at least one transistor, in particular at least one MOSFET (Metal Oxide Semiconductor Field Effect Transistor (FET)), wherein a PMOS transistor is a so-called p-channel MOSFET and an NMOS transistor is a so-called n-channel MOSFET.

In order to enable appropriate polarity reversal protection, a sensor and heating apparatus according to the invention may also have a polarity reversal protection device, wherein the polarity reversal protection device is preferably assigned to the first assembly and, in particular, is connected in series with the second switching device on that connection side of the second switching device which faces away from the second connection of the heating and sensor element. As a result of the series circuit according to the invention for electrically connecting the two assemblies, wherein the second assembly is particularly preferably supplied with signals and/or energy only via the first assembly and the electrical connecting device, a single polarity reversal protection device is sufficient in many cases.

In a further advantageous configuration of a sensor and heating apparatus according to the present invention, the combined sensor and heating apparatus also has a further, in particular fifth, switching device arranged between the first switching device and the third switching device and connected in series with the first switching device and the third switching device, wherein this further switching device is preferably likewise part of the second assembly and is particularly preferably likewise a PMOS switching device, in particular. However, a fifth switching device in the form of an NMOS is also conceivable.

This further, in particular fifth, switching device is preferably arranged in this case between the electrical connecting device, which is used to electrically connect the first switching device and the third switching device to one another, in particular between the electrical connecting device and an associated sensor connection node, in particular the third sensor connection node, and particularly preferably can be controlled by at least one control device, preferably by a control device configured to at least partially control the sensor device, in particular by the second control device. This fifth switching device makes it possible to further improve the capture accuracy of a sensor and heating apparatus according to the invention since it enables decoupling from undesirable potential fluctuations at the first pole which are each associated with a change in the capacitive coupling of the combined heating and sensor element to the environment and/or to a reference electrode and may likewise result in a distortion of the captured capacitive coupling or a change in the latter.

In a further advantageous configuration of a sensor and heating apparatus according to the present invention, the sensor and heating apparatus also has a further, in particular sixth, switching device arranged between the fourth switching device and the second switching device and connected in series with the fourth switching device and the second switching device, wherein this further switching device is preferably likewise part of the second assembly and is particularly preferably likewise an NMOS switching device, in particular. However, a sixth switching device in the form of a PMOS is also conceivable.

This further, in particular sixth, switching device is preferably arranged in this case between the electrical connecting device, which is used to electrically connect the fourth switching device and the second switching device to one another, in particular between the electrical connecting device and an associated sensor connection node, in particular the fourth sensor connection node, and particularly preferably can be controlled by at least one control device, preferably by a control device configured to at least partially control the sensor device, in particular by the second control device. This sixth switching device makes it possible to further improve the capture accuracy of a sensor and heating apparatus according to the invention, in particular enables decoupling from undesirable potential fluctuations at the second pole which are each associated with a change in the capacitive coupling of the combined heating and sensor element to the environment and/or to a reference electrode and may likewise result in distortion of the captured capacitive coupling or a change in the latter.

In a further advantageous configuration of a sensor and heating apparatus according to the present invention which has, in particular, at least one further switching device, in particular a fifth switching device and/or a sixth switching device, the sensor and heating apparatus also has a further, in particular fifth, sensor connection node which is arranged between the fifth switching device and the first switching device and can be electrically connected to the first connection of the combined heating and sensor element via the fifth switching device and the third switching device, and/or a further, in particular sixth, sensor connection node which is arranged between a sixth switching device and the second switching device, and/or a further, in particular sixth, sensor connection node which is arranged between a sixth switching device and the second switching device and/or between the second switching device and the second pole and can be electrically connected to the second connection of the combined heating and sensor element via the sixth switching device and the fourth switching device, wherein at least one control device, in particular the second control device, is designed and configured to apply a defined stabilization potential, for example +5 V or the like, but preferably a zero potential, that is to say earth (0 V), to this sensor connection node, wherein the control device preferably has for this purpose at least one output which is or can be electrically connected to the further sensor connection node, in particular via at least one further switching device, in particular via a seventh switching device or an eighth switching device, wherein the fifth sensor connection node is or can be electrically connected to the control device, in particular via a seventh switching device, and the sixth sensor connection node is or can be electrically connected via an eighth switching device. In this case, the fifth sensor connection node and the sixth sensor connection node may be electrically connected or connectable to the same output of an associated control device or to different outputs. A stabilization potential which is applied to the fifth sensor connection node and a stabilization potential which is applied to the sixth sensor connection node are particularly preferably identical in order to achieve a particularly good stabilization effect.

The seventh switching device and/or the eighth switching device may each be closed, in particular, in order to operate the sensor and heating apparatus as a sensor device and may preferably each be opened in order to operate the sensor and heating apparatus as a heating device, wherein the seventh switching device and/or the eighth switching device is/are particularly preferably always opened when operating the sensor and heating apparatus as a heating device and is/are particularly preferably always closed when operating the sensor and heating apparatus as a sensor device.

Such a configuration of a sensor and heating apparatus according to the invention makes it possible to apply a defined stabilization potential to the fifth and/or sixth sensor connection node, thus making it possible to stabilize the capacitive coupling of the combined heating and sensor element to the environment and/or to a reference electrode, in particular to set it to a defined reference level. As a result, the magnitude of the capacitive coupling can be decoupled from the operating voltage actually present at the voltage source, with the result that operating voltage fluctuations no longer result in a change in the capacitive coupling, thus making it possible to improve the capture accuracy of the sensor device. If a zero potential is selected as the stabilization potential, the eighth switching device, the sixth sensor connection node and the sixth switching device may be dispensed with, wherein a zero potential must likewise be applied in this case as stabilization potential to the fifth sensor connection node. This makes it possible to provide a particularly simple and cost-effective configuration of a sensor and heating apparatus according to the invention having a high capture accuracy.

If the synchronization device is part of the control device configured to at least partially control a sensor function, at least one synchronization connection node may coincide with a sensor connection node. Therefore, there is no need for an additional electrical path, in particular an additional electrical connecting line and/or an additional electrical path, wherein the synchronization connection node preferably coincides with the third, fourth, fifth or sixth sensor connection node, if present, particularly preferably with the fifth or sixth sensor connection node, in order to be able to capture the actual state of the heating device in a manner as immediately close as possible to the first switching device or the second switching device.

In principle, however, the actual state of the heating device may also be tapped off from the first electrical path and/or from the second electrical path via one or more separate synchronization connection nodes and corresponding separate, further electrical paths.

A separate tapping-off operation, that is to say via one or more separate synchronization connection nodes, has the advantage that it is possible, in principle, to capture the actual state of the heating device even during a capacitive measurement, that is to say during measurement operation or sensor operation, whereas use of one or more of the sensor connection nodes does not allow this since they are needed during a capacitive measurement to feed in an input measurement signal, to tap off an output measurement signal, to apply a compensation signal and/or a stabilization potential.

In a further possible, in particular advantageous, configuration of a combined capacitive sensor and heating apparatus according to the present invention, the synchronization device is particularly preferably designed and configured to detect at least a switched-on state and/or a heating state and/or a switched-off state and/or an off state as the actual state of the heating device on the basis of the captured actual voltage, in particular on the basis of the captured actual voltage profile over time, and/or on the basis of the captured actual current flow, in particular on the basis of the captured actual current flow over time.

In this case, the synchronization device is preferably designed and configured in such a manner that a switched-on state is detected as the instantaneous actual state of the heating device if a rising actual voltage and/or a rising actual voltage profile and/or a rising actual current flow or a rising actual current flow profile, in particular a rising edge of a heating power pulse, is/are captured.

In contrast, a heating state is preferably detected as the instantaneous actual state of the heating device if a constant actual voltage that differs from a zero voltage (0 V) and/or a constant actual voltage profile that differs from a zero voltage (0 V) and/or a constant actual current flow that differs from a zero current (0 A) or a constant actual current flow profile that differs from a zero current (0 A), in particular a constant plateau of a heating power pulse, is/are captured.

A switched-off state is detected, in particular, as the instantaneous actual state of the heating device if a falling actual voltage and/or a falling actual voltage profile and/or a falling actual current flow or a falling actual current flow profile, in particular a falling edge of a heating power pulse, is/are captured.

An off state is preferably detected as the instantaneous actual state of the heating device if a zero voltage (0 V) is captured as a constant actual voltage and/or a constant zero voltage profile is captured as an actual voltage profile and/or a zero current is captured as a constant actual current flow or a constant zero current profile is captured as an actual current flow profile, in particular a constant zero plateau of a heating power pulse.

A capacitive sensor and heating apparatus according to the invention may also be designed, in particular in one development, to capture a period duration of a heating period and to additionally control the sensor device, in particular, on the basis thereof, for example by determining a time difference between detecting two switching-on operations or two switching-off operations, or a length of a heating pulse or a heating pause by determining a time difference between a switching-on operation and a switching-off operation or vice versa.

In a further possible, in particular advantageous, configuration of a combined capacitive sensor and heating apparatus according to the present invention, the synchronization device is designed and configured, in particular, to initiate sensor operation of the combined sensor and heating element, in particular immediately or with a defined time delay, if a switched-off state or a switched-on state of the heating device has been detected. This makes it possible to control the sensor device in a particularly advantageous manner.

In a further possible, in particular advantageous, configuration of a combined capacitive sensor and heating apparatus according to the present invention, the synchronization device is preferably designed and configured to generate and output, in particular to the control and evaluation device which is designed and configured to at least partially control the sensor device, a sensor operation starting signal, in particular a digital sensor operation starting signal, for the purpose of initiating sensor operation, wherein the control and evaluation device which is designed and configured to at least partially control the sensor device is preferably designed and configured, in one or more steps upon or after receiving a sensor starting signal, to control all switching devices which can be controlled by it in the first electrical path and in the second electrical path in such a manner that these switching devices are opened and, preferably in a further step, to carry out at least one capacitive measurement for detecting the presence of a capacitively effective actuation means in a detection region of the sensor device and/or a sensor diagnosis.

In response to a detected switched-off state, that is to say in response to a detected falling edge of a heating pulse, sensor operation can be initiated preferably immediately or with a defined time delay by controlling, for example, all switching devices in the first electrical path and in the second electrical path, which can be controlled by the associated control and evaluation device for controlling the sensor function, in such a manner that they open. A capacitive measurement, for example, can then be subsequently carried out, for example as described above, preferably by feeding in a compensation signal. If it is also detected that the sensor and heating element is switched off at all poles, a stabilization potential, in particular, can also be applied, for example.

As long as at least one switching device remains open, which can be easily achieved if at least one switching device can be controlled only by the control device for controlling the sensor function (sensor control device), the heating device cannot initiate any changeover to heating operation.

In order to avoid an error message from the heating device in the case of separate control devices, because the heating device attempts to output a heating power, for example, and uses a diagnostic function to check whether all switches are closed, a corresponding status signal, for example, which is generated by the sensor control device and can be transmitted to the control device of the heating device (heating control device), for example via a data bus, can be used, in particular in one development of the present invention, to intercept or suppress a corresponding error message.

Alternatively or additionally, in response to a detected switched-on state, that is to say in response to a detected rising edge of a heating pulse, sensor operation can fundamentally also be initiated, preferably likewise as described above, by preferably controlling all switching devices in the first electrical path and in the second electrical path, which can be controlled by the associated control and evaluation device for controlling the sensor function, in such a manner that they open. A capacitive measurement, for example, can then likewise be subsequently carried out, in particular as described above, preferably by feeding in a compensation signal. If it is also detected that the sensor and heating element is switched off at all poles, a stabilization potential, in particular, can also be applied, for example.

However, if sensor operation is intended to be initiated in response to a rising edge of a heating pulse, it is advantageous to do this with a defined time delay in order to avoid unnecessarily reducing the output heating power by prematurely opening one or more switching devices in the first or second electrical path, in particular still during a heating power pulse.

However, if it can be discerned that a period of time between two heating power pulses presumably does not suffice to carry out a complete measurement cycle, a sensor diagnosis and/or a plausibility check, the initiation of sensor operation in response to the detection of a switched-on state, in the case of a configuration according to the invention of a combined sensor and heating apparatus, provided that the latter has one or more further switching devices in the first or second electrical path which can also be controlled by the sensor control device, makes it possible to easily interrupt a heating power pulse by means of the sensor control device and therefore to shorten a heating cycle and change to sensor operation. Time can consequently be saved.

In this case, the time delay may be predefined, in particular, and stored in the synchronization device, in particular, or may have been transmitted once by the heating device or may be transmitted repeatedly, in particular via a data bus, upon the starting of the synchronization device or may be determined from one or more captured actual states, for example from a determined duration of a heating period, in particular from the last determined duration, for example. The time delay is particularly preferably dependent on a pulse duration of a heating power pulse of pulse width modulation or is determined on the basis thereof.

Sensor operation can preferably be initiated, in particular, in response to a detected switched-off state. However, if an interval of time between two heating power pulses does not appear to be sufficient, sensor operation can preferably be initiated in response to a detected switched-on state, wherein this can preferably change depending on the operation of the heating device, with the result that the control of the sensor device can be adapted to the control of the heating device in a particularly advantageous and dynamic manner.

In one possible embodiment, the sensor control device may also output a signal to the heating device in order to initiate closing of the switching devices which can be controlled by the heating device, wherein the heating device is preferably designed in this case to receive and accordingly evaluate this signal and to control the associated switching devices in the desired manner.

In a further possible, in particular advantageous, configuration of a combined capacitive sensor and heating apparatus according to the present invention, the sensor and heating apparatus is designed and configured, in particular, to terminate sensor operation immediately and/or after expiry of a defined time, in particular immediately after expiry of the defined time, after completion of a capacitive measurement, wherein the sensor and heating apparatus is preferably designed and configured to change to heating operation after termination of sensor operation, wherein the control and evaluation device which is designed and configured to at least partially control the sensor device is designed and configured, in particular, after completion of the capacitive measurement and/or expiry of the defined time, in one or more steps, to control all switching devices which can be controlled by it in the first electrical path and in the second electrical path in such a manner that said switching devices are closed.

In a method according to the present invention for operating a combined capacitive sensor and heating apparatus according to the invention, the sensor and heating apparatus is operated selectively, in particular alternately, as a heating device or as a sensor device, wherein, in order to operate the sensor and heating apparatus as a heating device, the combined sensor and heating element is operated as an electrical heating element, wherein, in order to switch on the heating device, all switching devices along the first electrical path and all switching devices along the second electrical path are closed and, in order to switch off the heating device, at least one switching device along the first electrical path, preferably at least the first switching device, in particular all switching devices along the first path, and at least one switching device along the second electrical path, preferably at least the second switching device, in particular all switching devices along the second path, are opened, and wherein, in order to operate the sensor and heating apparatus as a sensor device, the combined sensor and heating element is operated as a capacitive sensor electrode and at least one switching device of the first electrical and at least one switching device of the second electrical path, in particular all switching devices along the first electrical path and all switching devices along the second electrical path, are opened.

A method according to the invention for operating a sensor and heating apparatus according to the invention is characterized in that an actual voltage applied to the first electrical path between the first pole of the voltage source and the first connection of the combined sensor and heating element, in particular an actual voltage profile over time, and/or an instantaneous actual current flow, in particular an actual current flow profile over time, is/are captured along the first electrical path, and/or an actual voltage applied to the second electrical path between the second connection of the combined sensor and heating element and the second pole, in particular an actual voltage profile over time, and/or an instantaneous actual current flow, in particular an actual current flow profile over time, is/are captured along the second electrical path, preferably (in each case) via a synchronization connection node and an electrical path which is or can be electrically connected to the synchronization device, wherein an instantaneous actual state of the heating device is determined on the basis of the captured actual voltage and/or the captured actual current flow, and the sensor device is at least controlled at least partially and/or at least one control signal for at least partially controlling the sensor device is output on the basis of the determined actual state of the heating device.

A method according to the invention makes it possible to operate the sensor device in a manner flexibly adapted to the operation of the heating device without a separate additional synchronization signal, even when a pulsed heating power is output with a variable pulse frequency, pulse duration and/or pause time between two pulses.

In one possible, in particular advantageous, embodiment of a method according to the present invention, the heating power, in particular a desired heating power, is output in a pulsed manner, preferably on the basis of a requirement, wherein a pulsed current flow, in particular with a defined, preferably constant, voltage, is preferably guided through the at least one combined sensor and heating element for this purpose, wherein the pulsed current flow is modulated, in particular, by means of pulse width modulation in such a manner that the desired heating power, in particular a desired average heating power, is output, wherein, in particular, a period duration, a pulse width and/or a spacing between two pulses (pause time) and/or a pulse height (voltage level) can be changed for this purpose.

In a further possible, in particular advantageous, embodiment of a method according to the present invention, sensor operation, in particular one or more capacitive measurements for detecting the presence of a capacitively effective actuation means in a detection region of the sensor device and/or a diagnosis of the sensor device, is carried out at least partially, in particular completely, between two heating power pulses, wherein, in particular, at least one switching device is controlled and opened for this purpose, in particular by a control and evaluation device for controlling the sensor device.

In one possible, in particular advantageous, embodiment of a method according to the present invention, the actual voltage and/or an actual current flow and/or a corresponding profile is/are captured in this case via at least one further electrical path and via a synchronization connection node which is situated along the first electrical path between the first switching device and the first connection of the combined sensor and heating element and is or can be electrically connected to the first electrical path and/or via at least one further electrical path and via a synchronization connection node which is situated along the second electrical path between the second connection of the combined sensor and heating element and the second switching device and is or can be electrically connected to the second electrical path.

In one advantageous embodiment of a method according to the present invention, at least a switched-on state and/or a heating state and/or a switched-off state and/or an off state is/are particularly preferably determined as the actual state of the heating device, wherein a switched-on state is determined as the instantaneous actual state of the heating device if a rising actual voltage and/or a rising actual voltage profile and/or a rising actual current flow or a rising actual current flow profile, in particular a rising edge of a heating power pulse, is/are captured, and/or a heating state is determined as the instantaneous actual state of the heating device if a constant actual voltage that differs from a zero voltage (0 V) and/or a constant actual voltage profile that differs from a zero voltage (0 V) and/or a constant actual current flow that differs from a zero current (0 A) or a constant actual current flow profile that differs from a zero current (0 A), in particular a constant plateau of a heating power pulse, is/are captured, and/or a switched-off state is determined as the instantaneous actual state of the heating device if a falling actual voltage and/or a falling actual voltage profile and/or a falling actual current flow or a falling actual current flow profile, in particular a falling edge of a heating power pulse, is/are captured, and/or an off state is determined as the instantaneous actual state of the heating device if a zero voltage (0 V) is captured as a constant actual voltage and/or a constant zero voltage profile is captured as an actual voltage profile and/or a zero current is captured as a constant actual current flow or a constant zero current profile is captured as an actual current flow profile, in particular a constant zero plateau of a heating power pulse.

In one possible, particularly advantageous, embodiment of a method according to the present invention, sensor operation of the combined sensor and heating element is initiated, in particular immediately or with a defined time delay, if a switched-off state, that is to say, in particular, a falling edge of a heating power pulse, or a switched-on state, that is to say, in particular, a rising edge of a heating power pulse, of the heating device has been detected or determined as the actual state of the heating device.

In order to initiate sensor operation, the corresponding switching devices are each accordingly controlled, preferably opened in particular, by at least one control device.

In one advantageous embodiment of a method according to the invention, a defined input measurement signal is fed in at least occasionally at a first sensor connection node, if present, during operation of the sensor and heating apparatus as a sensor device, preferably by means of a control device which is designed and configured to at least partially control a sensor function, in particular by means of the second control device, and a defined output measurement signal is tapped off at a second sensor connection node, if present, and is captured and evaluated, in particular, wherein a defined compensation signal which corresponds, in particular, to the input measurement signal is possibly also applied, in particular at the same time, to a further sensor connection node, if present, in particular to a third sensor connection node, and/or, if present, to a further connection node, in particular to a fourth sensor connection node, and wherein a defined stabilization potential, in particular a zero potential, is possibly also applied, in particular at the same time, to a further sensor connection node, if present, in particular to a fifth connection node, and/or to a further connection node, in particular to a sixth connection node.

This makes it possible to achieve a particularly high capture accuracy of the capacitive coupling of the heating and sensor element to an environment and/or to a reference electrode. The stabilization potential can also be applied only to the fifth connection node. However, this presupposes a suitable configuration of a sensor and heating apparatus according to the invention, in particular a configuration in which a zero potential is applied to the fifth connection node, which does not have a sixth switching device and in which a zero potential is likewise applied to the fifth switching device on its connection side facing the second pole, that is to say the fifth switching device is earthed (0 V). This makes it possible to provide a particularly advantageous sensor and heating apparatus which requires only a few components and therefore enables a very simple structure with only very few switching devices.

A steering input apparatus assembly, in particular a steering wheel assembly, according to the present invention for a vehicle having a part which is on the steering wheel side and has in particular at least one steering wheel module, in particular a steering wheel having a steering wheel module, and a part on the vehicle body side, in particular a steering column module, wherein, in a functional installation state of the steering input apparatus assembly in a vehicle, the part on the steering wheel side can be moved relative to the part on the vehicle body side, in particular can be rotated with respect to the part on the vehicle body side, in particular about an axis of rotation of a steering shaft, is characterized in that the steering input apparatus assembly has a combined capacitive sensor and heating apparatus according to the invention.

If the sensor and heating apparatus has a first assembly and a second assembly, the first assembly of the combined capacitive sensor and heating apparatus is preferably integrated in that part of the steering input apparatus assembly which is on the vehicle body side and the second assembly of the combined capacitive sensor and heating apparatus is integrated in that part of the steering input apparatus assembly which is on the steering wheel side, wherein the first assembly and the second assembly are electrically connected to one another by way of an electrical connecting device, in particular for the purpose of transmitting signals and/or energy, wherein the electrical connecting device is a coil spring, in particular.

In one preferred configuration of a steering input apparatus assembly according to the present invention, the steering input apparatus assembly also preferably has a steering wheel, wherein the combined sensor and heating element is particularly preferably integrated in the steering wheel in this case, wherein the steering wheel has, in particular, a metal steering wheel core which can preferably have a defined reference potential electrically applied to it or is permanently electrically contact-connected to a defined reference potential, wherein the steering wheel core is designed or configured, in particular, as a reference electrode and/or as a shielding device, in particular a shielding electrode, wherein the same potential as the fifth switching device and/or the sixth switching device, in particular a zero potential, that is to say earth, can particularly preferably be applied to the metal steering wheel core.

A vehicle according to the invention is characterized in that it has a steering input apparatus assembly according to the invention, wherein the part on the steering wheel side can be moved relative to the part on the vehicle body side, in particular can be rotated, in particular about an axis of rotation of a steering shaft.

In one advantageous configuration of a vehicle, the vehicle also has a voltage source having a first pole and a second pole, in particular a DC voltage source, wherein the first connection of the combined sensor and heating element of the combined capacitive sensor and heating apparatus can be electrically connected to and electrically disconnected from the first pole of a voltage source at least via the first switching device and the second switching device and the third switching device which are each connected in series with one another, and the second connection of the combined sensor and heating element can be electrically connected to and electrically disconnected from the second pole of the voltage source at least via the fourth switching device and the fifth switching device which are each connected in series with one another.

The advantageous configurations and embodiments presented with respect to a sensor and heating apparatus according to the invention and their advantages accordingly also apply to a method according to the invention for operating a sensor and heating apparatus according to the invention, to a steering input apparatus assembly according to the invention and to a vehicle according to the invention.

Further features of the invention are evident from the claims, the figures and the description of the figures. All of the features and combinations of features that are cited in the description above, and also the features and combinations of features that are cited in the description of the figures below and/or are shown in the figures alone, can be used not only in the respectively indicated combination but also in other combinations or on their own if these combinations are feasible and in particular technically expedient.

The invention is now explained in more detail on the basis of some preferred, nonrestrictive exemplary embodiments and with reference to the accompanying drawings, in which functionally identical components are provided with the same reference signs.

Figure 2:
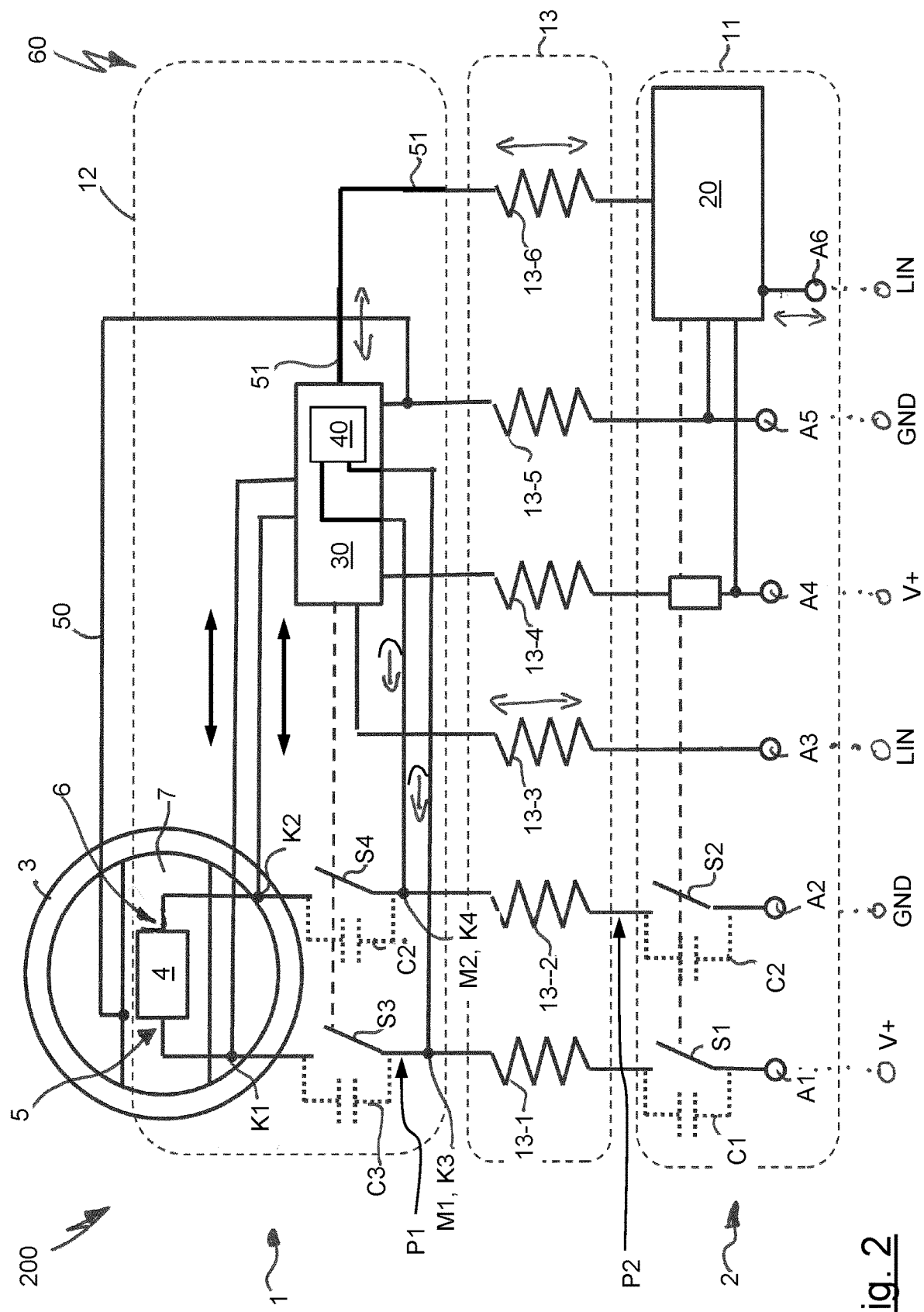
Figure 3:
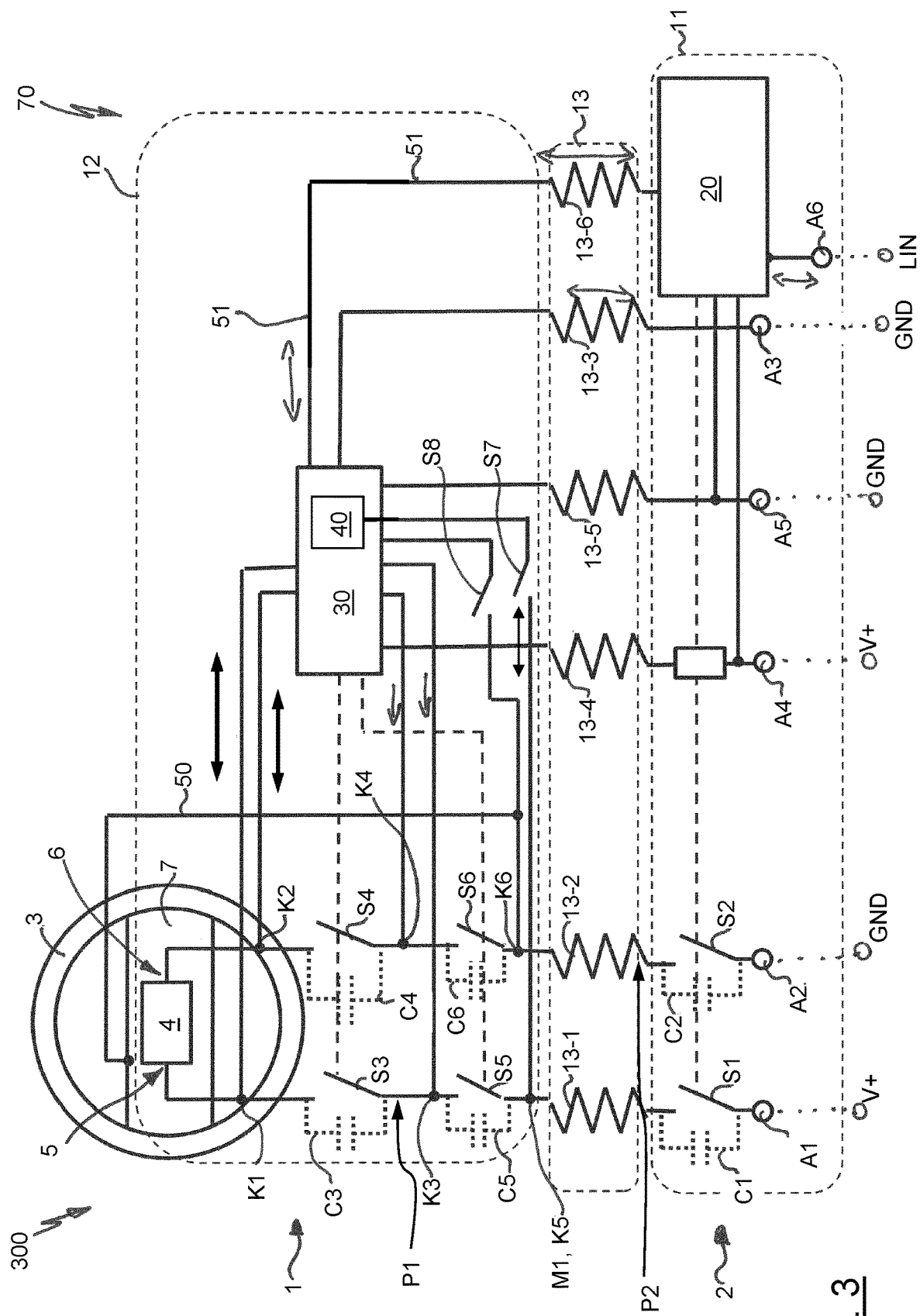

In a schematic illustration:

FIG. 1 shows a basic circuit diagram of a first exemplary embodiment of a steering input apparatus assembly according to the invention having a first exemplary embodiment of a sensor and heating apparatus according to the invention, FIG. 2 shows a basic circuit diagram of a second exemplary embodiment of a steering input apparatus assembly according to the invention having a second exemplary embodiment of a sensor and heating apparatus according to the invention, and FIG. 3 shows a basic circuit diagram of a third exemplary embodiment of a steering input apparatus assembly according to the invention having a third exemplary embodiment of a sensor and heating apparatus according to the invention.

FIG. 1 shows a first exemplary embodiment of a steering input apparatus assembly 100 according to the invention for a vehicle having a part 1 on the steering wheel side, in particular having a steering wheel 3, and a steering wheel module which is not described in any more detail here and is designed to be integrated in the steering wheel 3, and having a part 2 on the vehicle body side, in particular a steering column module 2, wherein, in a functional installation state of the steering assembly 100 in a vehicle, the part 1 on the steering wheel side can be moved relative to the part 2 on the vehicle body side, wherein the part 1 on the steering wheel side can be rotated relative to the part 2 on the vehicle body side, in particular about an axis of rotation of a steering shaft of the vehicle.

According to the invention, the steering input apparatus assembly 100 has a sensor and heating device 10 according to the invention, wherein, in this exemplary embodiment, the sensor and heating device 10 according to the invention has a first assembly 11 and a second assembly 12, wherein the first assembly 11 is integrated in that part 2 of the steering input apparatus assembly 100 which is on the vehicle body side and the second assembly 12 is integrated in the part 1 on the steering wheel side. In this case, the first assembly 11 and the second assembly 12 are electrically connected to one another via an electrical connecting device 13 in the form of a coil spring 13 which has, in particular, a flat conductor having a plurality of individual conductor tracks 13-1, 13-2, 13-3, 13-4, 13-5 and 13-6 which are insulated from one another.

According to the present invention, the combined capacitive sensor and heating apparatus 10 has an electrical combined sensor and heating element 4 which can be used both as an electrical heating element 4 by a heating device, which is not described here in any more detail and is part of the combined sensor and heating apparatus 10 according to the invention, and as a capacitive sensor element 4, in particular a capacitive sensor electrode 4, by a capacitive sensor device which is likewise not described in any more detail and is part of the combined sensor and heating apparatus 10 according to the invention.

The combined sensor and heating element 4 has a first connection 5 and a second connection 6, wherein the first connection 5 can be electrically connected to and electrically disconnected from the first pole V+ of a DC voltage source, to which a positive operating voltage V+ is applied in particular, preferably of approximately +12 V, as is conventional in a vehicle, via a first electrical path P1 having a first switching device S1 and a third switching device S3 connected in series with the latter and via a first connecting connection A1. In order to electrically connect the first connection 5 of the sensor and heating element 4, the first switching device S1 and the third switching device S3 may be closed. For electrical disconnection from the first pole V+, at least the first switching device S1, preferably additionally also the third switching device S3 in this exemplary embodiment, can be opened specifically, that is to say when required.

The second connection 6 of the combined sensor and heating element 4 can be electrically connected to and electrically disconnected from a second pole GND of the voltage source, in particular a second pole GND of a DC voltage source, to which a zero potential GND, that is to say earth (GND), is applied, via a second electrical path P2 having a fourth switching device S4 and a second switching device S2 connected in series with the fourth switching device S4 and via a second connecting connection A2. In order to electrically connect the second connection 6 of the sensor and heating element to the second pole GND of the voltage source, the second switching device S2 and the fourth switching device S4 can accordingly be closed and can be accordingly opened for electrical disconnection.

In the present case, the first switching device S1 here is a so-called high-side switching device (HSS) and the second switching device S2 is a low-side switching device (LSS), wherein the first switching device S1 and the third switching device S3 each have at least one PMOS switching element in this exemplary embodiment in a particularly advantageous embodiment. The second switching device S2 and the fourth switching device S4 each preferably have at least one NMOS switching element.

In this exemplary embodiment, the first switching device S1 and the second switching device S2 are assigned in this case to the first assembly 11 and the third switching device S3 and the fourth switching device S4 are assigned to the second assembly 12, wherein the third switching device S3 and the first switching device S1 as well as the second switching device S2 and the fourth switching device S4 are each electrically connected to one another according to the invention by means of the electrical connecting device 13, in particular via a first conductor track 13-1 or 13-2 of the electrical connecting device 13.

In this exemplary embodiment, in order to control the heating device, the sensor and heating apparatus 10 according to the invention also has a first control device 20 which is configured to control a heating function, wherein this first control device 20 is designed, in particular, to control the first switching device S1 and the second switching device S2, which is indicated by the dashed line which leads from the first control device 20 to the first switching device S1 and to the second switching device S2.

The first control device 20 can be electrically connected, for example, to a LIN bus of a vehicle via the connecting connection A6 and can be electrically connected to a first pole V+ of a voltage source, in particular to a first pole V+ of a DC voltage source, to which a positive operating voltage V+ is applied, via a connecting connection A4. The first control device 20 may also be electrically connected to a second pole GND, in particular a second pole GND of a DC voltage source, to which a zero potential GND, that is to say earth GND, is applied in particular, via a connecting connection A5.

In this exemplary embodiment of a sensor and heating apparatus 10 according to the invention, a second control device 30 is also provided for the purpose of controlling the sensor function, wherein this second control device 30 is designed, in particular, to control the third switching device S3 and the fourth switching device S4, which is indicated by the dashed line which leads from the second control device 30 to the third switching device S3 and to the fourth switching device S4.

The second control device 30 may likewise be electrically connected to a LIN bus, for example, via the conductor track 13-3 and the connecting connection A3 for the purpose of signal communication.

Like the first control device 20, the second control device 30 may likewise be electrically connected to the first pole V+ of the DC voltage source via the connecting connection A4 and also via the electrical connecting device 13, in particular via the associated conductor track 13-4, and the second control device 30 may be electrically connected to the second pole GND, that is to say to earth GND, via the connecting connection A5 and the electrical connecting device 13, in particular via the conductor track 13-5.

The steering wheel core 7 of the steering wheel 3 may likewise be electrically connected to the second pole GND via the electrical connecting device 13, in particular via the conductor track 13-5 and the connecting connection A5, in particular with the aid of a further connection line 50. As a result, a defined reference potential, in particular a zero potential GND, can be applied to the steering wheel core 7.

In this exemplary embodiment, the heating power, in particular a desired heating power, can be output in a pulsed manner, preferably on the basis of a requirement, wherein a pulsed current flow, in particular with a defined, preferably constant, voltage V+, is preferably guided through the combined sensor and heating element 4 for this purpose, wherein the pulsed current flow can be modulated by means of pulse width modulation in such a manner that the desired heating power, in particular a desired average heating power, is output, wherein, in particular, a period duration, a pulse width and/or a spacing between two pulses (pause time) can be changed for this purpose.

Sensor operation, in particular one or more capacitive measurements for detecting the presence of a capacitively effective actuation means in a detection region of the sensor device and/or a diagnosis of the sensor device, is carried out at least partially, in particular completely, between two heating power pulses.

In order to temporally coordinate the heating and sensor device, in particular in order to temporally coordinate the control of the first switching device S1 and of the second switching device S2 by the first control device 20 and the control of the third switching device S3 and the fourth switching device S4 by the second control device 30, this exemplary embodiment of a sensor and heating apparatus 10 according to the invention has, according to the invention, a synchronization device 40 which, in this exemplary embodiment, is integrated in the sensor control device 30 and is electrically connected to the first electrical path P1 via a separate electrical path 52 and a synchronization connection node M1.

According to the invention, the synchronization device 40 may capture, via this electrical path 52 and a synchronization connection node M1 that is separate in this case, an actual voltage applied to the first electrical path P1, in particular an actual voltage profile, and an actual current flow, in particular an actual current flow profile, and therefore an output heating power. According to the invention, the synchronization device 40 can determine an actual state of the heating device and can accordingly control the sensor device on the basis of the captured heating power, wherein the synchronization device 40 in this case is designed and configured, in particular, to immediately initiate sensor operation and to control the switching devices S3 and S4 in such a manner that they open if a switched-off state of the heating device, that is to say a falling edge in the output heating power, is detected. A capacitive measurement can then be carried out. After completion of the capacitive measurement, the third and fourth switching devices S3 and S4 are closed again. If necessary, sensor operation can alternatively be initiated if a switched-on state is detected, that is to say if a rising edge of the output heating power is detected, in particular with a defined time delay, in particular if an interval of time between two heating power pulses does not suffice to carry out a complete capacitive measurement.

In addition, the sensor control device 30 and the synchronization device 40 are electrically connected to the first control device 20 via a communication line 51 and the electrical connecting device 13, in particular via an associated conductor track 13-6, in order to be able to receive or the like, for example, one or more predefined values of the heating device which are stored as parameters, for example parameters for determining a required time delay such as a diagnosis duration of a diagnostic function of the heating device after a switching-on operation, for example once after the sensor and heating apparatus 100 according to the invention has been initialized after a first starting-up operation, and/or in order to transmit, for example, a status signal such as "sensor measurement in progress" to the heating device in order to possibly intercept or suppress an error message as a result of a diagnosis.

In order to operate the sensor and heating apparatus 10 as a heating device, in particular in order to switch on the heating device and therefore generate heat, the first switching device S1, the second switching device S2, the third switching device S3 and the fourth switching device S4 can be closed, wherein the first switching device S1 and the second switching device S2 can be accordingly controlled by the first control device 20 and the third switching device S3 and the fourth switching device S4 can each be controlled by the second control device 30 for this purpose, wherein the control of the first and second switching devices S1 and S2 and the control of the third and fourth switching devices S3 and S4 can be temporally coordinated with one another by means of the synchronization device 40, in particular with the aid of at least one synchronization signal.

In order to switch off the heating device and therefore terminate the generation of heat, in particular in order to terminate a current flow through the sensor and heating element 4, the first switching device S1, the second switching device S2, the third switching device S3 and the fourth switching device S4 can be opened in this exemplary embodiment, as a result of which the sensor and heating element 4 can be disconnected from the voltage supply at all poles.

In order to operate the combined sensor and heating apparatus 10 as a sensor device and therefore to operate the combined sensor and heating element as a capacitive sensor electrode, a defined input measurement signal, which may be fed in, in particular, at the first sensor connection node K1, may be applied to the sensor and heating element by the second control device 30 via a first sensor connection node K1 arranged between the third switching device S3 and the first connection 5 of the sensor and heating element 4. A corresponding output measurement signal may likewise be tapped off via the first sensor connection node K1, which is symbolized by the double-headed arrow on the associated connection lines which are not described in any more detail.

The second control device 30 may likewise feed in a defined input measurement signal and may tap off and evaluate an output measurement signal via a second sensor connection node K2, but, in particular, only when the measurement at the first sensor connection node K1 has been completed, wherein the output measurement signal captured at the second connection node K2 may preferably be compared, in particular, with the measurement signal captured at the first sensor connection node K1.

If a capacitively effective actuation means, for example a human hand, enters the detection region of the sensor device, the capacitive coupling of the sensor and heating element 4 to the environment and/or to a reference electrode is changed, which can be metrologically captured on the basis of the output measurement signal. The presence of a capacitively effective actuation means in the detection region of the sensor device can therefore be inferred on the basis of the received output measurement signal.

The first switching device S1, the second switching device S2, the third switching device S3 and the fourth switching device S4 each cause a respective associated parasitic capacitance to be produced, which are indicated here only using dashed lines and are denoted C1 to C4 and via which a current can likewise flow away in each case if the associated switching device S1, S2, S3 or S4 is open, thus possibly resulting in undesirable distortion of the output measurement signal.

In order to counteract this, in this exemplary embodiment of a sensor and heating apparatus 10 according to the invention, the second control device 30 is also designed to apply a defined compensation signal, which corresponds to the input measurement signal in particular, to a third sensor connection node K3 situated between the first switching device S1 and the third switching device S3, in particular between the electrical connecting device 13 and the third switching device S3, and to a fourth sensor connection node K4 situated between the second switching device S2 and the fourth switching device S4, in particular between the electrical connecting device 13 and the fourth switching device S4. As a result, a potential difference between the first sensor connection node K1 and the third sensor connection node K3 and between the second sensor connection node K2 and the fourth sensor connection K4 node can be virtually eliminated, thus making it possible to considerably reduce the undesirable flowing away of the input measurement signal via the third switching device S3 and also via the first switching device S1 and the undesirable flowing away of the output measurement signal via the fourth switching device S4 and also via the second switching device S2, which is associated with considerably less distortion of the output measurement signal and therefore an improved capture accuracy of the sensor and heating apparatus 10.

FIG. 2 shows a basic circuit diagram of a second exemplary embodiment of a steering input apparatus assembly 200 according to the invention having a second exemplary embodiment of a sensor and heating apparatus 60 according to the invention, wherein this sensor and heating apparatus 60 is based on the sensor and heating apparatus 10 according to the invention illustrated in FIG. 1. However, in this exemplary embodiment, the sensor and heating apparatus 60 does not have a separate electrical path 52 and a separate synchronization node M1 for tapping off a heating power from the first electrical path P1, but rather uses for this purpose the electrical paths and connections which are not described in any more detail and are respectively connected to the first electrical path P1 and to the second electrical path P2 via the sensor connection nodes K3 and K4. That is to say, the sensor connection nodes K3 and K4 are respectively used as synchronization connection nodes M1 and M2 here.

FIG. 3 shows a basic circuit diagram of a third exemplary embodiment of a steering input apparatus assembly 300 according to the invention having a third exemplary embodiment of a sensor and heating apparatus 70 according to the invention, wherein this sensor and heating apparatus 70 is based on the sensor and heating apparatus 60 according to the invention illustrated in FIG. 2, but additionally has a fifth switching device S5 with a fifth parasitic capacitance C5 and a sixth switching device S6 with a sixth parasitic capacitance C6, wherein the fifth switching device S5 is connected in series with the first switching device S1 and the third switching device S3 and is arranged, in particular, between the electrical connecting device 13 and the third switching device S3 and is assigned, in particular, to the second assembly 12. The sixth switching device S6 is connected in series with the second switching device S2 and the fourth switching device S4, in particular between the electrical connecting device 13 and the fourth switching device S4.

A defined reference potential can be respectively applied as a stabilization potential to a fifth sensor connection node K5 between the first switching device S1 and the fifth switching device S5, in particular between the electrical connecting device 13 and the fifth switching device S5, and between the second switching device S2 and the sixth switching device S6, in particular between the electrical connecting device 13 and the sixth switching device S6, by means of the second control device 30 if the further, seventh and eighth switching devices S7 and S8, which are likewise additionally present in comparison with the sensor and heating apparatus 10 depicted in FIG. 1, are closed. This makes it possible to decouple the capacitive coupling of the sensor electrode 4, that is to say of the sensor and heating element 4, to the environment and/or to a reference electrode, for example the steering wheel core 7, from a state of an applied operating voltage. Particularly advantageous decoupling arises if the stabilization potential applied to the fifth sensor connection node K5 and to the sixth sensor connection node K6 is a zero potential, that is to say earth.

In this exemplary embodiment, the sensor connection node K5 is used as a synchronization connection node M1 which can be used to capture an actual state of the heating device, in particular an output heating power.

If the stabilization potential is 0 V, that is to say earth, the steering wheel core 7, instead of being connected to earth GND via the connecting connection A5, as shown in FIG. 1, may also be connected via the connection line connected to the switching device S7.

Such a stabilization potential of 0 V, that is to say to GND, makes it possible, beyond the exemplary embodiments described, to dispense with the sixth switching device S6, the eighth switching device S8 and the sixth sensor connection node K6.

In accordance with a method according to the invention, a capacitive sensor and heating apparatus 10, 60, 70 according to the invention is operated selectively, in particular alternately, as a heating device or as a sensor device, wherein, in order to operate the sensor and heating apparatus 10, 60, 70 as a heating device, the combined sensor and heating element 4 is operated as an electrical heating element, wherein, in order to switch on the heating device, all switching devices S1 to S6, with which the combined sensor and heating element 4 is connected in series, are closed and, in order to switch off the heating device, at least the first switching device S1 and/or the second switching device S2 is/are opened, and wherein, in order to operate the sensor and heating apparatus 10, 60, 70 as a sensor device, the combined sensor and heating element 4 is operated as a capacitive sensor electrode and at least the first switching device S1 and/or the second switching device S2, in particular all switching devices S1 to S6, with which the combined sensor and heating element 4 is connected in series, is/are opened.

For this purpose, the switching devices S1 to S6 of the sensor and heating apparatus 10, 60, 70 are accordingly controlled by at least one control device 20, 30, wherein at least the first switching device S1 and/or the second switching device S2 is/are preferably accordingly controlled by a first control device 20, in particular assigned to the first assembly 11, and the other switching devices S3 to S6, in particular the third switching device S3 and/or the fourth switching device S4 and/or the fifth switching device S5 and/or the sixth switching device S6 and/or the seventh switching device S7 and/or the eighth switching device S8, are preferably controlled by a second control device 30, in particular assigned to the second assembly 12.

The first control device 20 and the second control device 30 are particularly preferably operated in this case in a manner temporally coordinated, that is to say in particular synchronized, with one another, in particular with the aid of a synchronization device 40 which is particularly preferably designed and configured to control the sensor device on the basis of a captured actual state of the heating device and to initiate sensor operation, in particular in response to a rising and/or falling edge of a heating power pulse.

In one advantageous embodiment of a method according to the invention, a defined input measurement signal is fed in at least occasionally at the first sensor connection node K1 during operation of the sensor and heating apparatus 10, 60, 70 as a sensor device, in particular by means of the second control device 30, and a defined output measurement signal is tapped off at the second sensor connection node K2, in particular likewise by means of the second control device 30, which output measurement signal is, in particular, captured and evaluated, in particular likewise by means of the second control device 30. In this case, a defined compensation signal, which corresponds in particular to the input measurement signal, is possibly also applied, in particular at the same time, to a third sensor connection node K3 between the first switching device S1 and the third switching device S3, preferably to a sensor connection node between the fifth switching device S5 and the third switching device S3, and/or to a fourth sensor connection node K4 between the fourth switching device S4 and the second switching device S2, preferably between the fourth switching device S4 and the sixth switching device S6. A defined stabilization potential, in particular a zero potential GND, is possibly also applied, in particular at the same time, to a fifth sensor connection node K5 between the first switching device S1 and the fifth switching device S5, and/or to a sixth sensor connection node K6 between the sixth switching device S6 and the second pole GND of the voltage source, in particular between the sixth switching device S6 and the second switching device S2, wherein the seventh and eighth switching devices S7 and S8, in particular, are closed for this purpose.

Further configurations which are included in the patent claims but are not shown here are also possible within the scope of the invention.

LIST OF REFERENCE SIGNS 100, 200, 300 Exemplary embodiment of a steering input apparatus assembly according to the invention
10, 60, 70 Exemplary embodiment of a sensor and heating apparatus according to the invention
1 Part of the steering input apparatus assembly that is on the steering wheel side
2 Part of the steering input apparatus assembly that is on the vehicle body side
3 Steering wheel
4 Combined sensor and heating element
5 First connection of the sensor and heating element
6 Second connection of the sensor and heating element
7 Steering wheel core
11 First assembly
12 Second assembly
13 Electrical connecting device
13-1 . . . 13-6 Conductor tracks of the electrical connecting device
20 First control device
30 Second control device
40 Synchronization device
50 Connection line
51 Communication line, in particular LIN bus line
52 Further electrical path
A1 . . . A6 Connecting connection
C1 . . . C6 Parasitic capacitance of the associated switching device
GND Second pole of a voltage source, to which a zero potential (0 V) is applied in particular, that is to say earth
K1 . . . K6 Sensor connection node
M1, M2 Synchronization connection node
LIN Communication connection (LIN bus)
P1 First electrical path
P2 Second electrical path
S1 . . . S8 Switching device
V+ First pole of a voltage source, to which a positive operating voltage is applied in particular

The invention claimed is:

1. A combined capacitive sensor and heating apparatus comprising:
a capacitive sensor device for detecting a presence of a capacitively effective actuation means in a detection region of the sensor device, for detecting the presence of a human hand in a gripping region of a steering input apparatus; and
a heating device for the steering input apparatus of a vehicle,
wherein the combined capacitive sensor and heating apparatus has at least one electrical combined sensor and heating element which is configured to be used both as a capacitive sensor element by the sensor device and as an electrical heating element by the heating device,
wherein the combined sensor and heating element has a first connection and a second connection,
wherein the first connection of the combined sensor and heating element is configured to electrically connected to and electrically disconnected from a first pole of a voltage source via a first electrical path having at least one first switching device,
wherein the second connection of the combined sensor and heating element is configured to electrically connected to and electrically disconnected from a second pole of the voltage source via a second electrical path having at least one second switching device,
wherein, in order to operate the combined sensor and heating element as a sensor element, the first connection of the combined sensor and heating element is configured to electrically disconnected from the first pole of the voltage source by opening at least one switching device of the first electrical path, and the second connection of the combined sensor and heating element is disconnected from the second pole of the voltage source by opening at least one switching device of the second electrical path,
wherein, in order to operate the combined sensor and heating element as a heating element, the first connection of the combined sensor and heating element is configured to be electrically connected to the first pole of the voltage source by closing all switching devices of the first electrical path, and the second connection of the combined sensor and heating element is configured to be electrically connected to the second pole of the voltage source by closing all switching devices of the second electrical path, and
wherein the combined sensor and heating apparatus also has a synchronization device for at least partially synchronizing control of the sensor device and heating device,
wherein the synchronization device is electrically connected to the first electrical path or to the second electrical path via at least one further electrical path and is configured to capture, at least occasionally, an actual voltage applied to the first electrical path between the first pole of the voltage source and the first connection of the combined sensor and heating element comprising an actual voltage profile over time, or an instantaneous actual current flow along the first electrical path comprising an actual current flow profile over time, and/or to capture an actual voltage applied to the second electrical path between the second connection of the combined sensor and heating element and the second pole comprising an actual voltage profile over time, and/or an instantaneous actual current flow along the second electrical path comprising an actual current flow profile over time, wherein the synchronization device is configured to detect or determine an instantaneous actual state of the heating device on the basis of the captured actual voltage and/or on the basis of the captured actual current flow, and at least to at least partially control the sensor device and/or output at least one control signal for at least partially controlling the sensor device on the basis of the detected or determined actual state of the heating device.

2. The combined capacitive sensor and heating apparatus according to claim 1, wherein the combined capacitive sensor and heating apparatus is configured to output a heating power, in a pulsed manner, on the basis of a requirement, wherein a pulsed current flow is guided through the at least one combined sensor and heating element for this purpose, wherein the pulsed current flow is modulated by pulse width modulation in such a manner that the heating power is output.

3. The combined capacitive sensor and heating apparatus according to claim 2, wherein the combined capacitive sensor and heating apparatus is configured to carry out sensor operation, one or more capacitive measurements for detecting the presence of a capacitively effective actuation means in a detection region of the sensor device and/or a diagnosis of the sensor device, at least partially between two heating power pulses.

4. The combined capacitive sensor and heating apparatus according to claim 1, wherein the at least one further electrical path, via which the synchronization device captures an actual voltage and/or an actual current flow in the first electrical path or in the second electrical path, is electrically connected to the first electrical path via a synchronization connection node situated along the first electrical path between the first switching device and the first connection of the combined sensor and heating element and/or to the second electrical path via a synchronization connection node situated along the second electrical path between the second connection of the combined sensor and heating element and the second switching device.

5. The combined capacitive sensor and heating apparatus according to claim 1, wherein the combined sensor and heating apparatus further comprises at least one control and evaluation device configured to:
at least partially control the sensor device of the combined capacitive sensor and heating apparatus to control operation of the combined sensor and heating element as a sensor element, and
at least partially control the heating device of the combined capacitive sensor and heating apparatus for controlling operation of the sensor and heating element as a heating element.

6. The combined capacitive sensor and heating apparatus according to claim 5, wherein the combined sensor and heating apparatus is configured for integration in a steering input apparatus assembly of a motor vehicle having a part on the steering wheel side and a part on the vehicle body side, wherein the combined sensor and heating apparatus has a first assembly which is configured for integration in that part of a steering input apparatus assembly which is on the vehicle body side, and a second assembly which is configured for integration in that part of a steering input apparatus assembly which is on the steering wheel side, and
wherein some parts of the combined sensor and heating apparatus are assigned to the first assembly and other parts are assigned to the second assembly.

7. The combined capacitive sensor and heating apparatus according to claim 6, wherein the first assembly and the second assembly are electrically connected to one another via an electrical connecting device, wherein the electrical connecting device has a coil spring or is a coil spring.

8. A combined capacitive sensor and heating apparatus according to claim 6, wherein the control and evaluation device which is configured to at least partially control the sensor device is assigned to the second assembly, and the control and evaluation device which is configured to at least partially control the heating device is assigned to the first assembly.

9. The combined capacitive sensor and heating apparatus according to claim 6, wherein the synchronization device is part of the second assembly.

10. The combined capacitive sensor and heating apparatus according to claim 5, the control and evaluation device which is configured to at least partially control the heating device is configured to control the first switching device and/or the second switching device, wherein the first switching device and/or the second switching device are parts of the first assembly.

11. The combined capacitive sensor and heating apparatus according to claim 1, wherein the synchronization device is configured to detect or determine at least a switched-on state and/or a heating state and/or a switched-off state and/or an off state as the actual state of the heating device on the basis of the captured actual voltage, on the basis of a captured actual voltage profile over time, and/or on the basis of a captured actual current flow over time, wherein the synchronization device is configured in such a manner that a switched-on state is detected or determined as the instantaneous actual state of the heating device if a rising actual voltage and/or a rising actual voltage profile and/or a rising actual current flow or a rising actual current flow profile, or a rising edge of a heating power pulse, is/are captured, and/or a heating state is detected or determined as the instantaneous actual state of the heating device if a constant actual voltage that differs from a zero voltage (0 V) and/or a constant actual voltage profile that differs from a zero voltage (0 V) and/or a constant actual current flow that differs from a zero current (0 A) or a constant actual current flow profile that differs from a zero current (0 A) having a constant plateau of a heating power pulse, is/are captured, and/or a switched-off state is detected or determined as the instantaneous actual state of the heating device if a falling actual voltage and/or a falling actual voltage profile and/or a falling actual current flow or a falling actual current flow profile or a falling edge of a heating power pulse, is/are captured, and/or an off state is detected or determined as the instantaneous actual state of the heating device if a zero voltage (0 V) is captured as a constant actual voltage and/or a constant zero voltage profile is captured as an actual voltage profile and/or a zero current is captured as a constant actual current flow or a constant zero current profile is captured as an actual current flow profile or a constant zero plateau of a heating power pulse.

12. The combined capacitive sensor and heating apparatus according to claim 11, wherein the synchronization device is configured to initiate sensor operation of the combined sensor and heating element immediately or with a defined time delay, if a switched-off state or an off state or a switched-on state of the heating device has been detected.

13. The combined capacitive sensor and heating apparatus according to claim 1, wherein the sensor and heating apparatus is configured to terminate sensor operation immediately and/or after expiry of a defined time that is immediately after expiry of the defined time, after completion of a capacitive measurement, wherein the sensor and heating apparatus is configured to change to heating operation after termination of sensor operation.

14. A method for operating a combined sensor and heating apparatus according to claim 1, wherein the capacitive sensor and heating apparatus is operated selectively and alternately, as a heating device or as a sensor device, the method comprising:
    in order to operate the sensor and heating apparatus as a heating device, operating the combined sensor and heating element as an electrical heating element;
    in order to switch on the heating device, closing all switching devices along the first electrical path and along the second electrical path;
    in order to switch off the heating device, opening at least one switching device along the first electrical path and at least one switching device along the second electrical path;
    in order to operate the sensor and heating apparatus as a sensor device, operating the combined sensor and heating element as a capacitive sensor electrode and opening at least one switching device of the first electrical and at least one switching device of the second electrical path,
    capturing an actual voltage applied to the first electrical path between the first pole of the voltage source and the first connection of the combined sensor and heating element comprising an actual voltage profile over time, and/or an instantaneous actual current flow, comprising an actual current flow profile over time, along the first electrical path; and
    capturing an actual voltage applied to the second electrical path between the second connection of the combined sensor and heating element and the second pole comprising an actual voltage profile over time, and/or an instantaneous actual current flow, comprising an actual current flow profile over time, along the second electrical path,
    wherein an instantaneous actual state of the heating device is determined on the basis of the captured actual voltage and/or the captured actual current flow, and the sensor device is at least controlled at least partially and/or at least one control signal for at least partially controlling the sensor device is output on the basis of the determined actual state of the heating device.

15. The method according to claim 14, wherein sensor operation of the combined sensor and heating element is initiated immediately or with a defined time delay, if a switched-off state or a switched-on state of the heating device has been detected or determined as the actual state of the heating device.

16. A steering input apparatus assembly for a vehicle having a part which is on the steering wheel side and has a steering wheel having a steering wheel module, and a steering column module on a vehicle body side,
    wherein, in a functional installation state of the steering input apparatus assembly in a vehicle, the part of the steering input apparatus assembly which is on the steering wheel side is moved and rotated relative to the part on the vehicle body side about an axis of rotation of a steering shaft, and
    wherein the steering input apparatus assembly has a combined capacitive sensor and heating apparatus, according to claim 1.

17. A vehicle having a steering input apparatus assembly, wherein the steering input apparatus assembly is according to claim 16, wherein the part on the steering wheel side is moved and rotated relative to the part on the vehicle body side, about an axis of rotation of a steering shaft.

* * * * *